(12) United States Patent
Yamaguchi

(10) Patent No.: US 11,476,339 B2
(45) Date of Patent: Oct. 18, 2022

(54) METHOD OF MANUFACTURING SEMICONDUCTOR DEVICE

(71) Applicant: Renesas Electronics Corporation, Tokyo (JP)

(72) Inventor: Tadashi Yamaguchi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/858,857

(22) Filed: Apr. 27, 2020

(65) Prior Publication Data
US 2020/0258990 A1    Aug. 13, 2020

Related U.S. Application Data

(62) Division of application No. 15/909,980, filed on Mar. 1, 2018, now Pat. No. 10,680,071.

(30) Foreign Application Priority Data

May 19, 2017    (JP) ................................ 2017-100274

(51) Int. Cl.
*H01L 29/51*    (2006.01)
*H01L 29/66*    (2006.01)
(Continued)

(52) U.S. Cl.
CPC .. *H01L 29/40111* (2019.08); *H01L 21/02181* (2013.01); *H01L 21/02189* (2013.01);
(Continued)

(58) Field of Classification Search
CPC ............... H01L 29/516; H01L 29/6684; H01L 29/78391; H01L 21/02107–02112;
(Continued)

(56) References Cited

U.S. PATENT DOCUMENTS 5,990,507 A * 11/1999 Mochizuki ........ H01L 21/76895
257/295
6,140,672 A * 10/2000 Arita ................. H01L 21/76895
257/295
(Continued)

FOREIGN PATENT DOCUMENTS

JP    2010-519781 A    6/2010
JP    2012-084602 A    4/2012
JP    2016-534575 A    11/2016

OTHER PUBLICATIONS

Lee, Yao-Jen et al., "Low-Temperature Microwave Annealing for MOSFETs With High-k/Metal Gate Stacks", IEEE Electron Device Letters, vol. 34, No. 10, Oct. 2013, pp. 1286-1288.
(Continued)

*Primary Examiner* — Maliheh Malek
(74) *Attorney, Agent, or Firm* — SGPatents PLLC

(57) ABSTRACT

To allow a metal oxide film composed mainly of O and at least one of Hf and Zr to exhibit ferroelectric properties. After deposition of a hafnium oxide film on a semiconductor substrate via an insulating film, the semiconductor substrate is exposed to microwaves to selectively heat the hafnium oxide film. This makes it possible to form a larger number of orthorhombic crystals in the crystals of the hafnium oxide film. The hafnium oxide film thus obtained can therefore exhibit ferroelectric properties without adding, thereto, an impurity such as Si. This means that the hafnium oxide film having a reverse size effect can be used as a ferroelectric film of a ferroelectric memory cell and contributes to the manufacture of a miniaturized ferroelectric memory cell.

5 Claims, 19 Drawing Sheets

(51) Int. Cl.
*H01L 21/02* (2006.01)
*H01L 29/78* (2006.01)
*H01L 21/28* (2006.01)
*H01L 27/11568* (2017.01)
*H01L 21/3105* (2006.01)
*H01L 49/02* (2006.01)
*H01L 27/11507* (2017.01)
*H01L 27/1159* (2017.01)

(52) U.S. Cl.
CPC .. *H01L 21/02197* (2013.01); *H01L 21/02345* (2013.01); *H01L 21/02356* (2013.01); *H01L 21/3105* (2013.01); *H01L 27/11568* (2013.01); *H01L 28/40* (2013.01); *H01L 29/516* (2013.01); *H01L 29/6684* (2013.01); *H01L 27/1159* (2013.01); *H01L 27/11507* (2013.01); *H01L 29/78391* (2014.09)

(58) Field of Classification Search
CPC ......... H01L 21/02148; H01L 21/02159; H01L 21/02181; H01L 21/02189; H01L 21/0225; H01L 21/02277; H01L 21/02345; H01L 21/02356; H01L 21/026679; H01L 21/02672; H01L 21/28185; H01L 21/02; H01L 21/02027; H01L 21/02104; H01L 21/02227; H01L 21/0223; H01L 21/02233; H01L 21/02252; H01L 21/02255; H01L 21/02433; H01L 21/02609; H01L 21/02691
See application file for complete search history.

(56) References Cited

U.S. PATENT DOCUMENTS

| | | | |
|---|---|---|---|
| 6,144,060 A * | 11/2000 | Park | H01L 28/75 257/310 |
| 6,204,158 B1 * | 3/2001 | Hendrix | H01L 28/56 438/563 |
| 6,291,292 B1 * | 9/2001 | Yang | H01L 21/28525 257/E21.009 |
| 6,372,608 B1 * | 4/2002 | Shimoda | G02F 1/13454 438/455 |
| 6,497,992 B1 * | 12/2002 | Yunogami | H01L 21/02071 430/313 |
| 6,787,451 B2 * | 9/2004 | Shimamoto | H01L 21/28061 438/630 |
| 7,135,421 B2 * | 11/2006 | Ahn | H01L 21/28176 438/785 |
| 7,709,309 B2 * | 5/2010 | Moriwaka | H01L 21/02686 438/166 |
| 8,871,600 B2 | 10/2014 | Harame et al. | |
| 9,142,404 B2 * | 9/2015 | Tsai | H05B 6/806 |
| 9,231,206 B2 | 1/2016 | Tao et al. | |
| 9,263,498 B2 * | 2/2016 | Yamaguchi | H01L 27/1462 |
| 9,601,541 B2 * | 3/2017 | Yamaguchi | H01L 27/14612 |
| 9,935,235 B2 * | 4/2018 | Yamaguchi | H01L 31/022408 |
| 9,947,715 B2 * | 4/2018 | Yamaguchi | H01L 27/14689 |
| 2001/0012698 A1 * | 8/2001 | Hayashi | H01L 21/02205 438/782 |
| 2001/0041374 A1 * | 11/2001 | Hintermaier | C23C 16/56 438/3 |
| 2001/0041416 A1 * | 11/2001 | Torii | H01L 28/55 438/396 |
| 2002/0025453 A1 * | 2/2002 | Tatsumi | H01L 23/5329 428/697 |
| 2002/0076495 A1 * | 6/2002 | Maloney | H01L 21/02189 427/272 |
| 2003/0098497 A1 * | 5/2003 | Solayappan | H01L 28/57 257/629 |
| 2004/0067659 A1 * | 4/2004 | Black | H01L 21/02282 257/E21.271 |
| 2004/0101977 A1 * | 5/2004 | Celinska | C30B 29/68 438/785 |
| 2004/0110391 A1 * | 6/2004 | Ahn | H01L 21/0228 438/778 |
| 2004/0129961 A1 * | 7/2004 | Paz de Araujo | H01L 23/642 257/295 |
| 2004/0129987 A1 * | 7/2004 | Uchiyama | H01L 21/02197 257/E21.208 |
| 2004/0191930 A1 * | 9/2004 | Son | H01L 28/55 438/3 |
| 2005/0110070 A1 * | 5/2005 | Omura | H01L 27/0629 257/311 |
| 2005/0136556 A1 * | 6/2005 | Matsuura | H01L 27/11507 438/3 |
| 2006/0068536 A1 * | 3/2006 | Yamazaki | H01L 27/1214 438/197 |
| 2006/0157733 A1 * | 7/2006 | Lucovsky | H01L 31/02161 257/192 |
| 2006/0175643 A1 * | 8/2006 | Nomura | H01L 28/55 257/295 |
| 2007/0078228 A1 * | 4/2007 | Tateishi | C08F 297/02 525/242 |
| 2008/0072684 A1 * | 3/2008 | Baniecki | G01L 1/148 73/777 |
| 2008/0224229 A1 * | 9/2008 | Tajima | H01L 27/11206 257/379 |
| 2008/0237678 A1 | 10/2008 | Datta et al. | |
| 2008/0258222 A1 * | 10/2008 | Cannon | H01L 21/76264 257/351 |
| 2008/0283837 A1 * | 11/2008 | Tanada | H01L 27/1237 257/59 |
| 2009/0261395 A1 * | 10/2009 | Boescke | H01L 21/02181 257/295 |
| 2010/0006746 A1 * | 1/2010 | Hirose | H01L 27/14621 250/208.2 |
| 2010/0006918 A1 * | 1/2010 | Ahn | H01L 21/31637 257/532 |
| 2010/0025853 A1 * | 2/2010 | Lindgren | H01L 23/5228 257/763 |
| 2010/0144106 A1 * | 6/2010 | Cho | H01L 27/10802 438/243 |
| 2012/0063209 A1 * | 3/2012 | Koyama | H01L 29/7869 365/149 |
| 2012/0086107 A1 * | 4/2012 | Yamamoto | H01L 21/0228 257/632 |
| 2012/0126300 A1 * | 5/2012 | Park | H01G 4/20 257/296 |
| 2012/0231580 A1 * | 9/2012 | Yamazaki | H01L 21/02636 438/104 |
| 2012/0248451 A1 * | 10/2012 | Sone | H01L 29/7869 257/59 |
| 2012/0276694 A1 * | 11/2012 | Koezuka | H01L 21/44 438/151 |
| 2012/0315730 A1 * | 12/2012 | Koezuka | H01L 29/4908 438/158 |
| 2013/0078788 A1 * | 3/2013 | Suguro | H01L 21/2686 438/513 |
| 2014/0008647 A1 * | 1/2014 | Yamazaki | H01L 29/24 257/43 |
| 2014/0065805 A1 * | 3/2014 | Suguro | H01L 21/67011 438/487 |
| 2014/0370645 A1 * | 12/2014 | Yamaguchi | H01L 27/1462 438/72 |
| 2015/0102341 A1 * | 4/2015 | Yamazaki | H01L 21/02403 257/43 |
| 2015/0104933 A1 * | 4/2015 | Tsai | H05B 6/806 438/482 |
| 2015/0287802 A1 * | 10/2015 | Lee | H01L 29/40111 257/105 |
| 2015/0311090 A1 * | 10/2015 | Isogai | H01L 21/31155 438/381 |
| 2015/0325684 A1 * | 11/2015 | Xu | H01L 29/42364 438/289 |

(56) References Cited

U.S. PATENT DOCUMENTS

| | | | | |
|---|---|---|---|---|
| 2015/0357370 | A1* | 12/2015 | Yamaguchi | H01L 27/14603 438/60 |
| 2016/0155850 | A1 | 6/2016 | Yamazaki | |
| 2016/0155852 | A1* | 6/2016 | Yamazaki | H01L 21/02554 257/43 |
| 2016/0163764 | A1* | 6/2016 | Yamaguchi | H01L 27/14638 438/60 |
| 2016/0196969 | A1* | 7/2016 | Berry, III | H01L 21/0274 438/694 |
| 2016/0197194 | A1* | 7/2016 | Okazaki | H01L 29/78606 257/43 |
| 2017/0033233 | A1* | 2/2017 | Yamazaki | H01L 27/1225 |
| 2017/0075155 | A1* | 3/2017 | Oikawa | G02F 1/133555 |
| 2017/0104090 | A1* | 4/2017 | Koezuka | H01L 29/78648 |
| 2017/0263783 | A1* | 9/2017 | Yamazaki | H01L 27/1225 |
| 2017/0317226 | A1* | 11/2017 | Yamaguchi | H01L 27/14698 |
| 2018/0159031 | A1* | 6/2018 | Paz de Araujo | H01L 27/249 |
| 2018/0182790 | A1* | 6/2018 | Yamaguchi | H01L 21/2256 |
| 2018/0301266 | A1* | 10/2018 | Ou | H03B 15/006 |
| 2019/0057860 | A1* | 2/2019 | Yoon | H01J 37/32091 |
| 2019/0115441 | A1* | 4/2019 | Tan | H01L 29/408 |
| 2019/0207009 | A1* | 7/2019 | Yamaguchi | H01L 27/11592 |
| 2019/0244973 | A1* | 8/2019 | Yoo | G11C 11/2273 |
| 2019/0355584 | A1* | 11/2019 | Yamaguchi | G11C 11/2259 |
| 2020/0075637 | A1* | 3/2020 | Yamazaki | H01L 21/02672 |

OTHER PUBLICATIONS

Su, Yin-Hsien et al., "Investigation of High-k/metal gate MOS Capacitors Annealed by Microwave Annealing as a Post-Metal Annealing Process", Proceedings of the 16$^{th}$ International Conference on Nanotechnology, Sendai, Japan, Aug. 22-25, 2016, pp. 773-776.

Extended European Search Report dated Jan. 23, 2019, in European Patent Application No. 18162922.1.

Office Action dated Jun. 11, 2021, in Taiwanese Patent Application No. 107115650.

Office Action dated Sep. 8, 2020, in Japanese Patent Application No. 2017-100274.

* cited by examiner

METHOD OF MANUFACTURING SEMICONDUCTOR DEVICE

CROSS-REFERENCE TO RELATED APPLICATIONS

The disclosure of Japanese Patent Application No. 2017-100274 filed on May 19, 2017 including the specification, drawings and abstract is incorporated herein by reference in its entirety.

BACKGROUND

The present invention relates to a method of manufacturing a semiconductor device, for example, a technology of manufacturing a semiconductor device using, as a ferroelectric film, a metal oxide film composed mainly of oxygen (O) and at least one of hafnium (Hf) and zirconium (Zr).

For example, Patent Document 1 describes a method of manufacturing an integrated circuit having a ferroelectric memory cell. It discloses a technology of depositing an amorphous layer containing hafnium oxide, zirconium oxide, or a mixed oxide of Hf and Zr, depositing a covering layer containing a dielectric, an oxide of a conductor, or a metal on the amorphous layer, and then heating and crystallizing the amorphous layer. This Patent Document 1 also describes that addition of silicon or the like to the amorphous layer contributes to the crystallization into a state having ferroelectric properties.

PATENT DOCUMENT

[Patent Document 1] U.S. Unexamined Patent Application Publication No. 2009/0261395

SUMMARY

A metal oxide film composed mainly of O and at least one of Hf and Zr exhibits ferroelectric properties even if it is thin so that a ferroelectric memory can be miniaturized by using this metal oxide film as a ferroelectric film of a ferroelectric memory or the like. There is therefore a demand for allowing a metal oxide film composed mainly of O and at least one of Hf and Zr to exhibit ferroelectric properties.

Another problem and novel features will be apparent from the description herein and accompanying drawings.

In one aspect, a method of manufacturing a semiconductor device includes a step of depositing a metal oxide film composed mainly of O and at least one of Hf and Zr on a semiconductor substrate and then selectively heating the metal oxide film with microwaves.

In another aspect, a method of manufacturing a semiconductor device includes a step of depositing a metal oxide film composed mainly of O and at least one of Hf and Zr on a semiconductor substrate, depositing a conductor film on the metal oxide film, and then selectively heating the metal oxide film with microwaves.

In a further aspect, a method of manufacturing a semiconductor device includes a step of depositing a metal oxide film composed mainly of O and at least one of Hf and Zr on a first conductor film and then selectively heating the metal oxide film with microwaves.

In a still further aspect, a method of manufacturing a semiconductor device includes a step of depositing a metal oxide film composed mainly of O and at least one of Hf and Zr on a first conductor film, depositing a second conductor film on the metal oxide film, and then selectively heating the metal oxide film with microwaves.

The above-described aspects make it possible to allow the metal oxide film composed mainly of O and at least one of Hf and Zr to exhibit ferroelectric properties.

DETAILED DESCRIPTION

Figure 1:
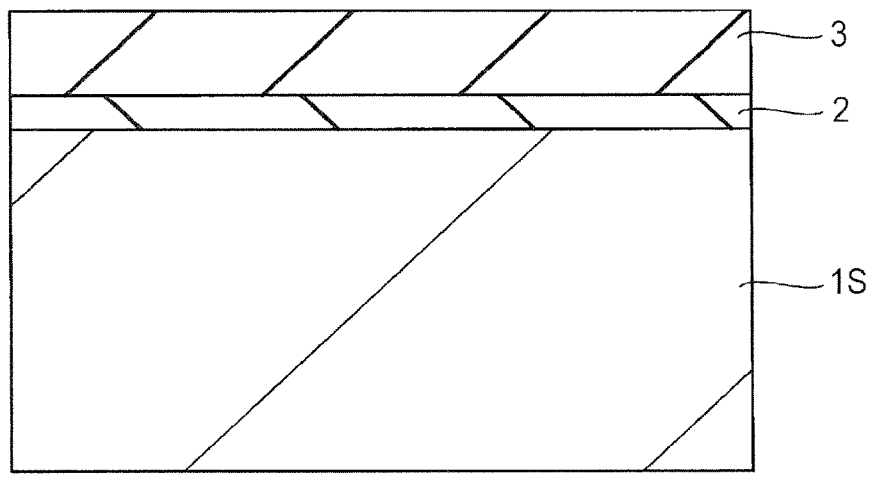
FIG. 1 is a fragmentary cross-sectional view of a semiconductor substrate during a step of forming a hafnium oxide film.

In the below-described embodiments, a description will be made after divided into a plurality of sections or embodiments if necessary for the sake of convenience. These sections or embodiments are not independent from each other unless otherwise particularly specified, but one of them may be a modification example, details, a complementary description, or the like of a part or whole of the other one.

In the below-described embodiments, when a reference is made to the number or the like (including the number, value, amount, range, or the like) of a component, the number is not limited to a specific number but may be more or less than the specific number, unless otherwise particularly specified or principally apparent that the number is limited to the specific number.

Further, it is needless to say that in the below-described embodiments, the constituent component (including component step or the like) is not always essential unless otherwise particularly specified or principally apparent that it is essential.

Still further, in the below-described embodiments, when a reference is made to the shape, positional relationship, or the like of the constituent component, a component substantially approximate or analogous thereto in shape or the like is also embraced unless otherwise particularly specified or principally apparent that it is not. This also applies to the above-described number and range.

In all the drawings for describing the following embodiment, the same members will be identified by the same reference numerals in principle and overlapping descriptions will be omitted. Even plan views are sometimes hatched to facilitate understanding of them.

<Results of Research by the Present Inventors>

A hafnium oxide (HfOx) film has ferroelectric properties even when it is thinned, in other words, has a reverse size effect so that use of this oxide film as a ferroelectric film of a ferroelectric memory or the like actualizes miniaturization of the ferroelectric memory or the like. It is therefore desired to allow the hafnium oxide film to exhibit ferroelectric properties.

To allow the hafnium oxide film to exhibit ferroelectric properties, formation of a crystal phase called "orthorhombic crystal" is required. The orthorhombic crystal is a metastable phase and is not stable. When a hafnium oxide film in amorphous phase state after film formation is subjected to heat treatment (up to 800° C.) by RTA (rapid thermal annealing), FA (furnace), or the like inevitably leads to formation of monoclinic crystals. It is reported that the above-described heat treatment performed after addition of a trace amount of an impurity such as silicon (Si) to a hafnium oxide film facilitates formation of orthorhombic crystals. In practice, however, it is difficult to form orthorhombic crystals by using RTA, FA, or the like and monoclinic crystals are inevitably formed by the heat treatment at high temperatures.

The present inventors therefore investigated heating, with radio waves (RF: Radio Frequency), of a hafnium oxide film in amorphous phase state after film formation. As a result, it has been found for the first time that by selectively heating a hafnium oxide film in amorphous phase state after film formation, for example, with 2.45 GHz microwaves, orthorhombic crystals are formed in the crystals of the hafnium oxide film even if an impurity such as silicon has not been added in advance. These research results will next be described referring to some drawings.

Figure 2:
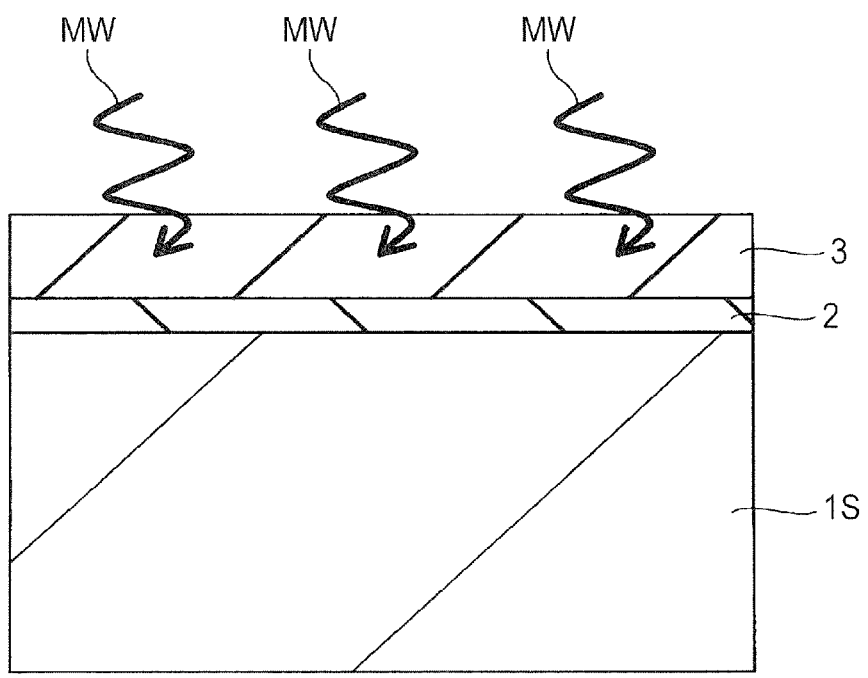
FIG. 2 is a fragmentary cross-sectional view of the semiconductor substrate during microwave heat treatment of the hafnium oxide film.

FIG. 1 is a fragmentary cross-sectional view of a semiconductor substrate during a step of forming a hafnium oxide film and FIG. 2 is a fragmentary cross-sectional view of the semiconductor substrate during microwave heat treatment of the hafnium oxide film. First, as shown in FIG. 1, a semiconductor substrate (which will hereinafter be called "substrate" simply) made of, for example, single crystal silicon (Si) is subjected to thermal oxidation treatment to form an insulating film (first insulating film) 2 made of, for example, a silicon oxide film on the main surface of the substrate 1S. The insulating film 2 has a thickness of, for example, from about 1 to 3 nm.

Then, a hafnium oxide film (metal oxide film) 3 composed mainly of, for example, hafnium (Hf) and oxygen (O) is deposited on the insulating film 2 by ALD (atomic layer deposition) or the like. The hafnium oxide film 3 after formation is in amorphous phase state and has a thickness of, for example, about 10 nm. An impurity such as silicon has not been added to the hafnium oxide film 3.

Then, as shown FIG. 2, the hafnium oxide film 3 in amorphous phase state is selectively heated with microwaves by exposing the substrate 1S to microwaves MW of, for example, 2.45 GHz. This means that the hafnium oxide film 3 is selectively heated by oscillating the polarization in the hafnium oxide film 3 with microwaves to crystallize the hafnium oxide film 3.

Figure 3:
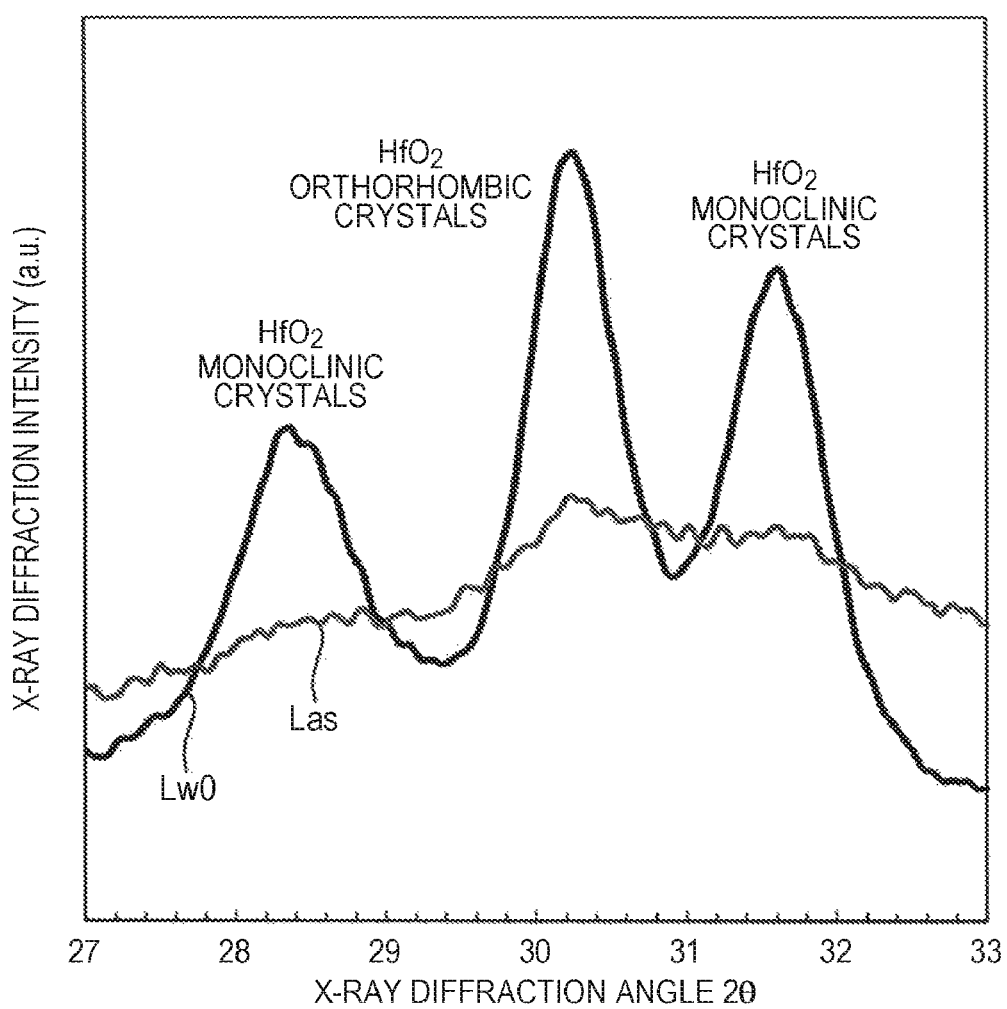
FIG. 3 is a graph showing the results of analyzing the crystals of the hafnium oxide film after microwave heat treatment.

FIG. 3 shows the results of analyzing the crystals of the hafnium oxide film after the heating treatment with microwaves. In FIG. 3, Las represents the results of analyzing the crystal structure of the hafnium oxide film 3 just after film formation (as-deposited film) and Lw0 represents the results of analyzing the crystal structure of the hafnium oxide film 3 after microwave heating. The crystals become orthorhombic at the peak near a diffraction angle of 30.4°. The crystals become monoclinic at the peaks near diffraction angles of 28.4° and 31.8°. A higher peak means presence of many crystals.

The research results by the present inventors have revealed that even when a hafnium oxide film to which an impurity such as silicon has not been added is subjected to usual heat treatment such as RTA or FA, the hafnium oxide film thus obtained has no orthorhombic crystals. In short, such a hafnium oxide film does not exhibit any ferroelectric properties.

On the other hand, the present inventors have found for the first time that as shown in FIG. 3, when the hafnium oxide film is heat treated with microwaves (Lw0), the hafnium oxide film 3 has, in the crystals thereof, many orthorhombic crystals even when an impurity such as silicon has not been added to the hafnium oxide film 3.

Figure 4:
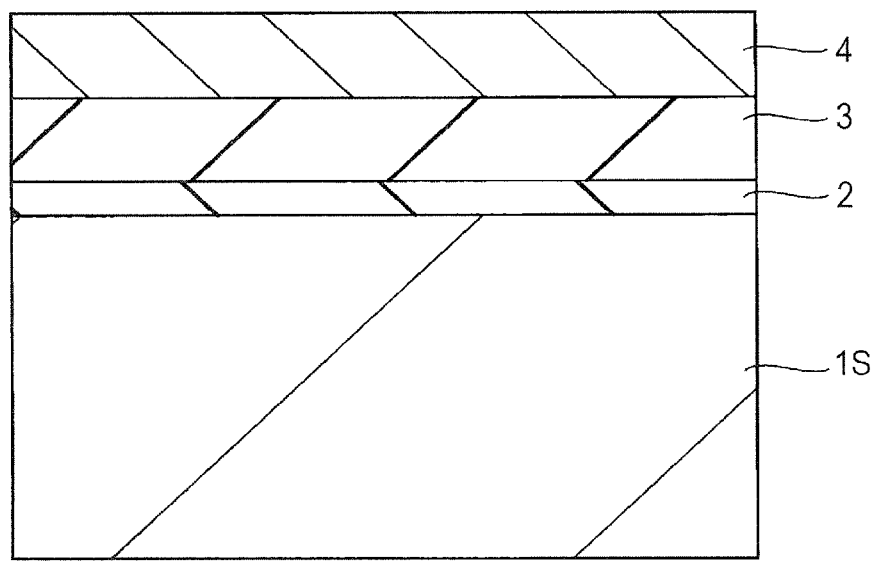
FIG. 4 is a fragmentary cross-sectional view of the semiconductor substrate after deposition of a cap conductor film on a hafnium oxide film.

Next, the present inventors investigated the crystal structure of a hafnium oxide film having thereon a cap conductor film composed mainly of titanium nitride (TiN) or the like. FIG. 4 is a fragmentary cross-sectional view of the substrate after deposition of a cap conductor film on a hafnium oxide film and FIG. 5 is a fragmentary cross-sectional view of the substrate during microwave heat treatment of the hafnium oxide film after the step of depositing the cap conductor film in FIG. 4.

First, as shown in FIG. 4, after formation of an insulating film 2 on the main surface of the substrate 1S in a manner similar to that described above, a hafnium oxide film 3 in amorphous phase state is deposited on the insulating film. Also in this case, an impurity such as silicon has not been added to the hafnium oxide film 3. The respective thicknesses of the insulating film 2 and the hafnium oxide film 3 are equal to those described in FIG. 1.

Then, a cap conductor film 4 composed mainly of, for example, TiN is deposited on the hafnium oxide film 3 in amorphous phase state. The thickness of the cap conductor film 4 is, for example, about 10 nm.

Figure 5:
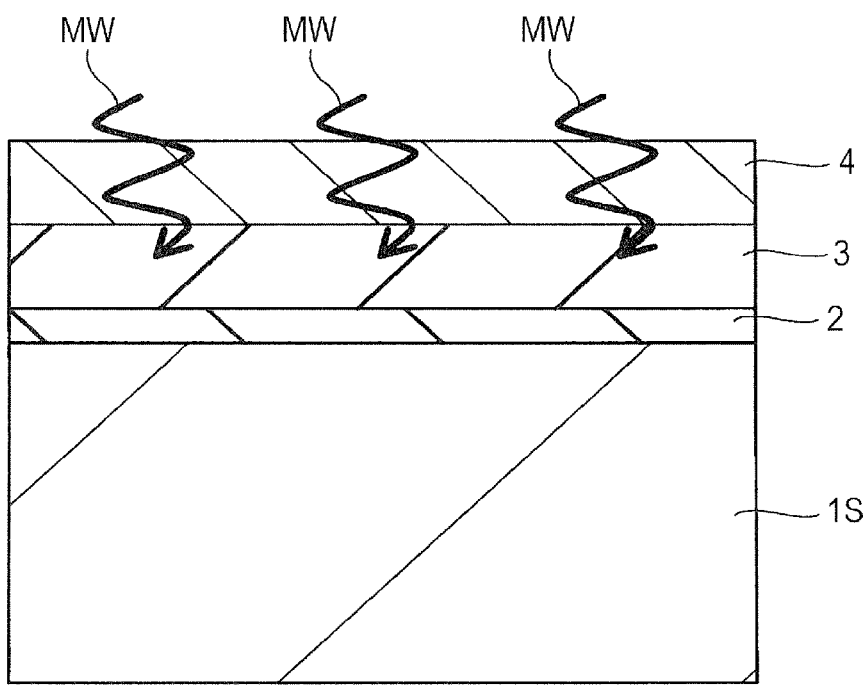
FIG. 5 is a fragmentary cross-sectional view of the semiconductor substrate during heating the hafnium oxide film with microwaves after the step of depositing the cap insulating film in FIG. 4.

After that, as shown in FIG. 5, the hafnium oxide film 3 in amorphous phase state is selectively heated with microwaves MW of, for example, 2.45 GHz to crystallize the hafnium oxide film 3.

Figure 6:
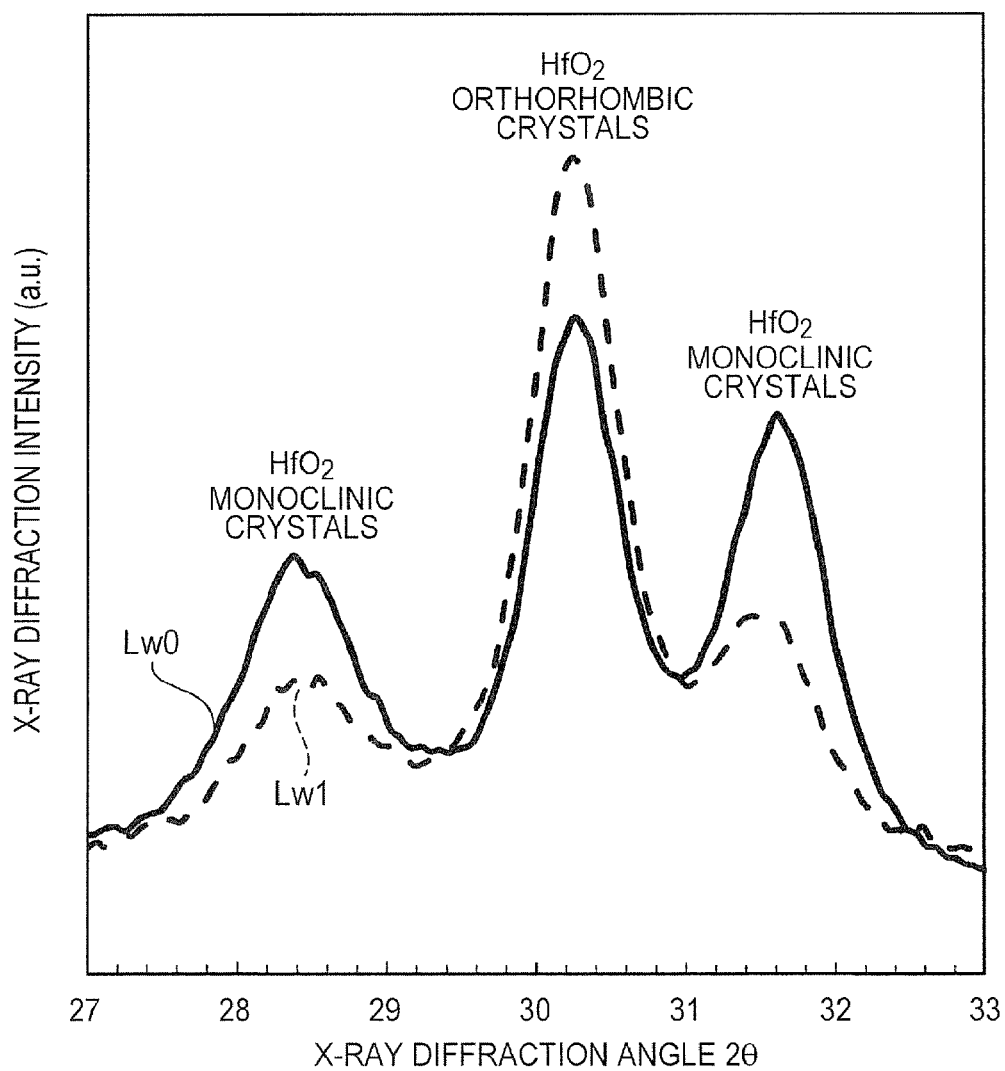
FIG. 6 is a graph showing comparison of the results of analysis of the crystals of the hafnium oxide film after microwave heating between when a cap conductor film is deposited and when it is not deposited.

FIG. 6 shows the comparison results of the analysis of the crystals of the respective hafnium oxide films 3 having and not having thereon the cap conductor film 4 after microwave heating. In this graph, Lw0 represents the results of analyzing the crystal structure of the hafnium oxide film 3 after microwave heat treatment in the case where the hafnium oxide film has thereon no cap conductor film 4 as in FIG. 3, while LW1 represents, in a dotted line, the results of analyzing the crystal structure of the hafnium oxide film 3 after microwave heat treatment in the case where the hafnium oxide film has thereon the cap conductor film 4. The crystals become orthorhombic at the peak near a diffraction angle of 30.4° and the crystals become monoclinic at the peaks near diffraction angles of 28.4° and 31.8°. It is apparent from FIG. 6 that when the hafnium oxide film has thereon the cap conductor film 4 (Lw1), the number of monoclinic crystals in the crystals of the hafnium oxide film 3 becomes smaller and in addition, the number of orthorhombic crystals becomes greater (meaning that the hafnium oxide film 3 exhibits ferroelectric properties) than that when the hafnium oxide film does not have thereon the cap conductor film 4 (Lw0).

Figure 7:
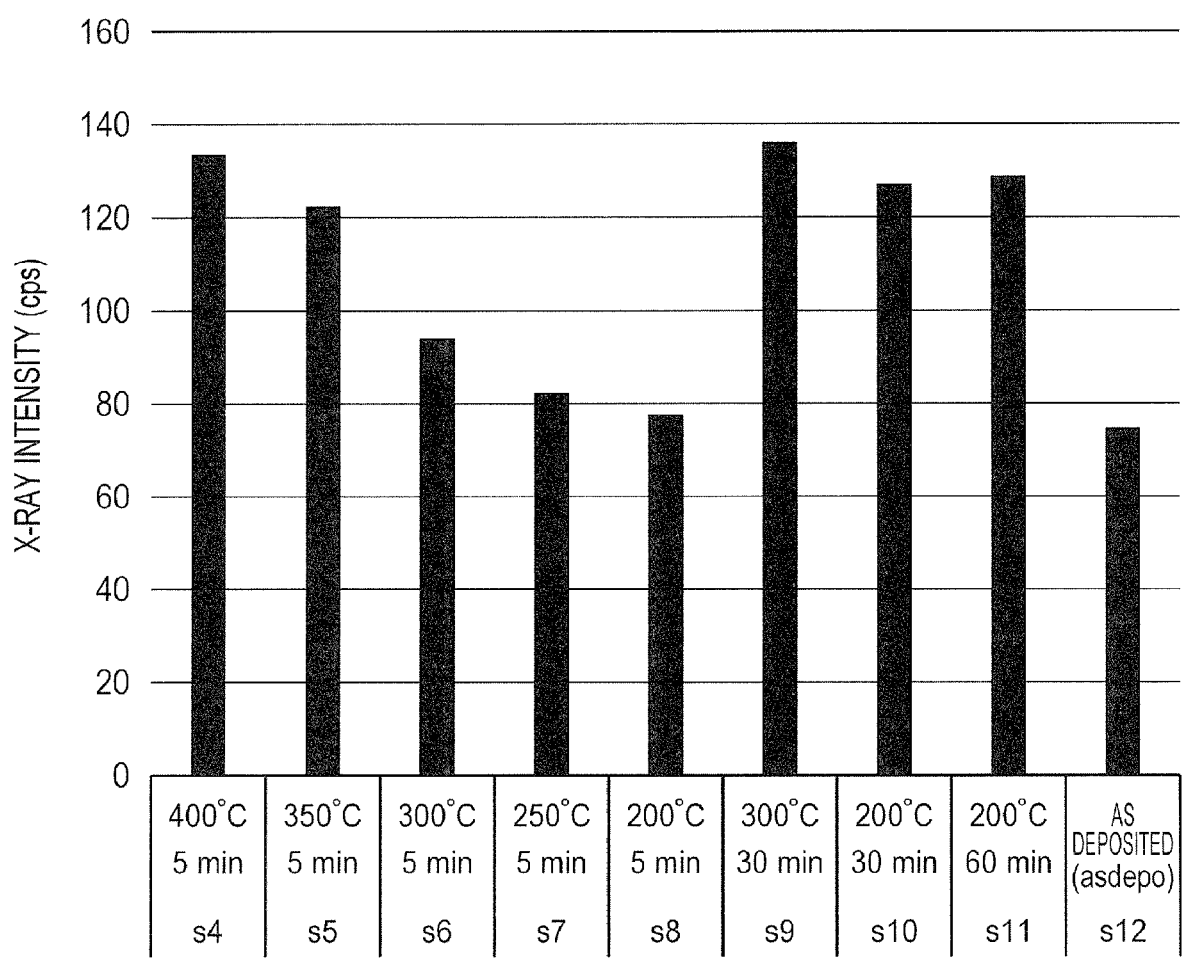
FIG. 7 is a graph showing the X-ray intensity of orthorhombic crystals in the crystals of the hafnium oxide film after microwave heating under each heating condition (temperature and time)

FIG. 7 is a graph showing the X-ray intensity of orthorhombic crystals in the crystals of the hafnium oxide film 3 after microwave heating under each heating condition (temperature and time). FIG. 7 has revealed that the number of orthorhombic crystals in the crystals of the hafnium oxide film 3 becomes the maximum, for example, under the following heating conditions: at 400° C. for 5 minutes and at 300° C. for 30 minutes.

Figure 8:
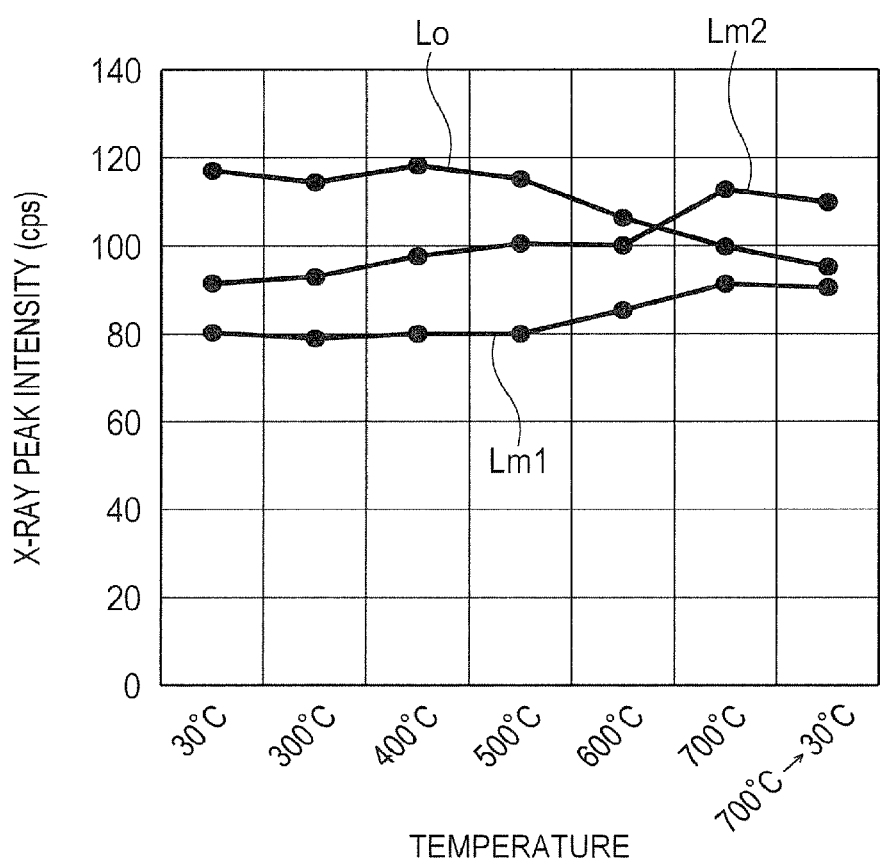
FIG. 8 is a graph showing the relationship between heating temperature and X-ray peak intensity of the crystals of the hafnium oxide film after microwave heating.

FIG. 8 shows the relationship between heating temperature and X-ray peak intensity of the crystals of the hafnium oxide film 3 after microwave heating, in which line Lo is of orthorhombic crystals and lines Lm1 and Lm2 are of monoclinic crystals. FIG. 8 has revealed that at the heating temperature of 600° C. or more, the number of orthorhombic crystals in the crystals of the hafnium oxide film 3 decreases, while the number of monoclinic crystals increases due to recrystallization.

It is apparent from FIGS. 7 and 8 that the optimum temperature at the time of microwave heating is, for example, 300° C. or more and less than 600° C., preferably 300° C. or more and 500° C. or less, most preferably 300° C. or more and 400° C. or less. This temperature is measured using a temperature sensor such as a thermocouple installed at the back surface of the substrate 1S at the time of microwave heat treatment.

Figure 9:
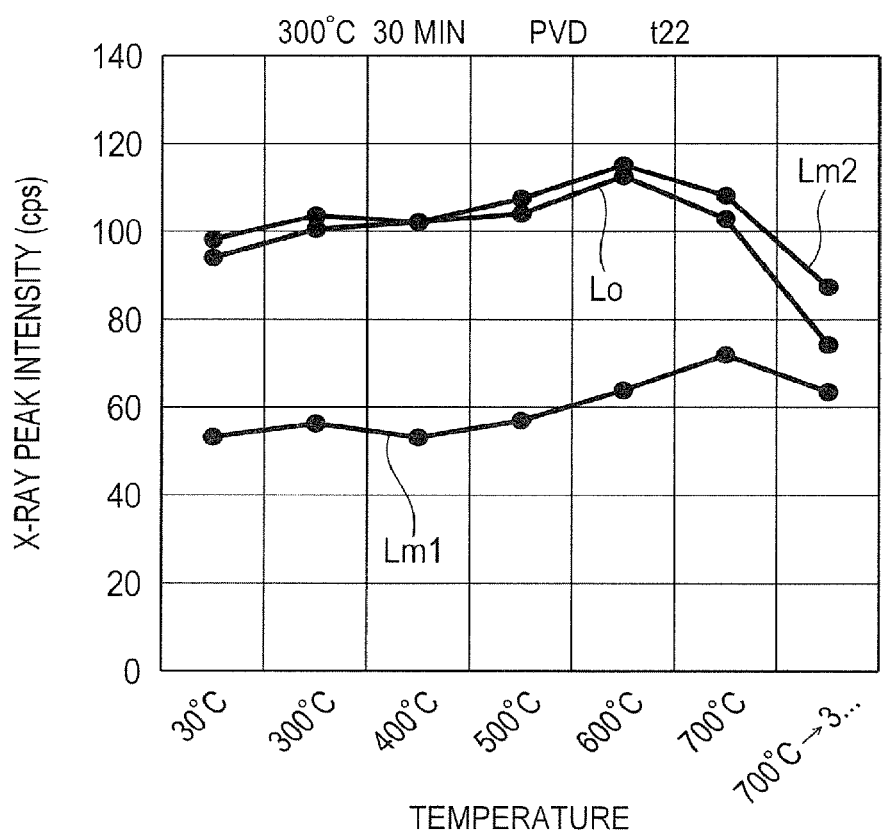
FIG. 9 is a graph showing the X-ray peak intensity of the crystals of the hafnium oxide film when the cap conductor film is deposited using PVD.
Figure 10:
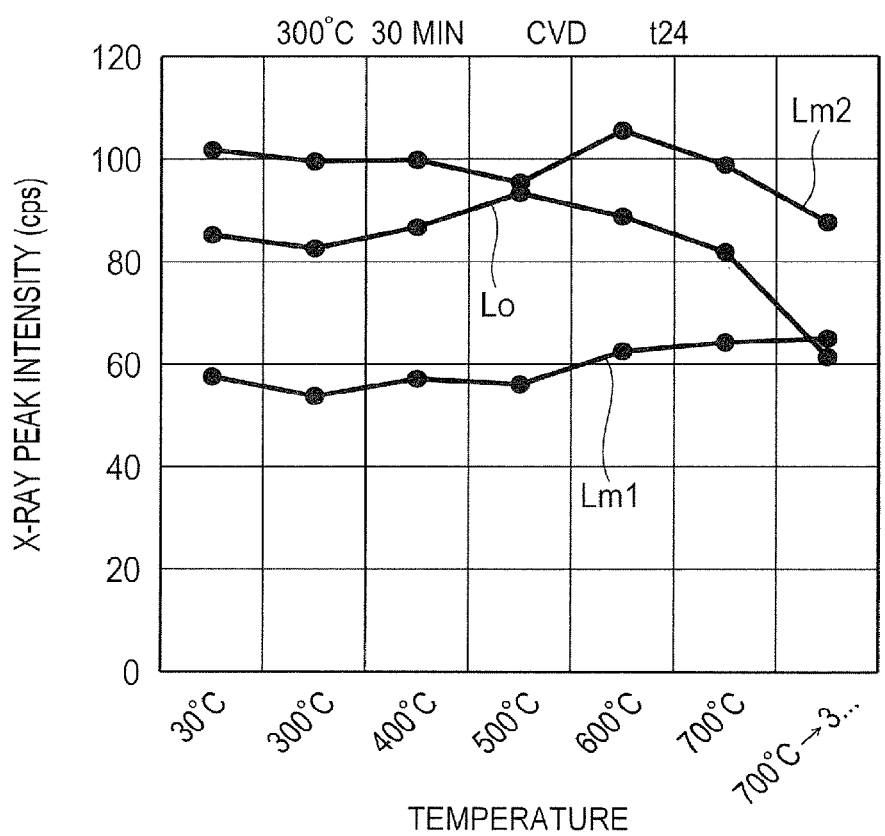
FIG. 10 is a graph showing the X-ray peak intensity of the crystals of the hafnium oxide film when the cap conductor film is deposited using CVD.
Figure 11:
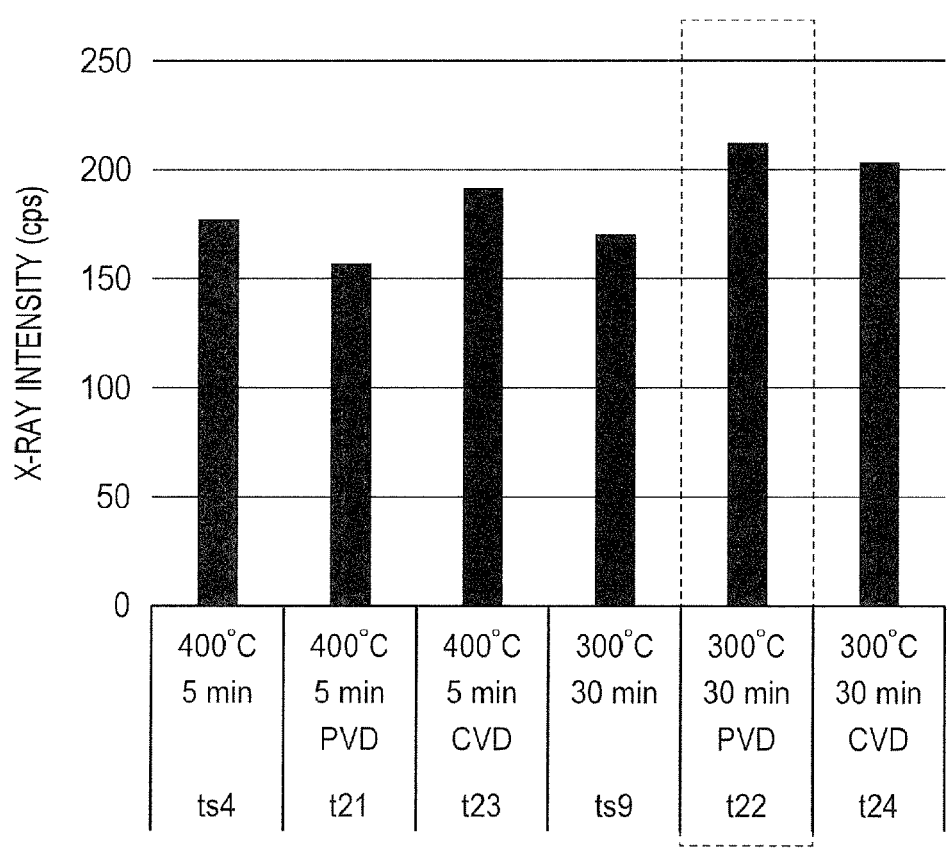
FIG. 11 is a graph showing the X-ray intensity of orthorhombic crystals in the crystals of the hafnium oxide film after microwave heating under each condition (heating temperature, heating time, and depositing method of the cap conductor film)

In addition, the present inventors investigated whether a change in the crystals in the hafnium oxide film occurs or not depending on a difference in a method of forming the cap conductor film 4. FIG. 9 is a graph showing the X-ray peak intensity of the crystals of the hafnium oxide film 3 when the cap conductor film 4 is deposited using PVD (physical vapor deposition). FIG. 10 is a graph showing the X-ray peak intensity of the crystals of the hafnium oxide film 3 when the cap conductor film 4 is deposited using CVD (chemical vapor deposition). FIG. 11 is a graph showing the X-ray intensity of orthorhombic crystals of the hafnium oxide film 3 after microwave heating under each heating condition (heating temperature, heating time, and depositing method of the cap conductor film 4).

It becomes apparent from FIGS. 9 and 10 that the number of orthorhombic crystals formed in the hafnium oxide film 3 is larger when the cap conductor film 4 is deposited by PVD than by CVD. It becomes apparent from FIG. 11 that the number of orthorhombic crystals formed in the hafnium oxide film 3 is the maximum when microwave heating is performed, for example, under the following conditions: at about 300° C. for 30 minutes. In other words, it becomes apparent that the number of orthorhombic crystals formed in the hafnium oxide film 3 becomes the maximum by depositing the cap conductor film 4 on the hafnium oxide film 3 in an amorphous state by low-temperature less-damage PVD and then heating the hafnium oxide film 3 with microwaves.

Further, it becomes apparent from the research results by the present inventors that by using the above-described method, the number of orthorhombic crystals in the hafnium oxide film 3 can be maintained (meaning that the ferroelectric properties of the hafnium oxide film 3 can be maintained) even by heating the hafnium oxide film 3 with microwaves for crystallization and then performing heat treatment at a higher temperature.

This can also be applied to, not only a hafnium oxide film, but also zirconium oxide (ZrOx) composed mainly of zirconium and O or a metal oxide film composed mainly of Hf, Zr, and O. In the above example, the insulating film 2 is formed on the main surface of the substrate 1S before formation of the hafnium oxide film 3, but formation of the insulating film 2 is not always necessary. Even if it is not formed, the resulting hafnium oxide film exhibits similar ferroelectric properties.

First Embodiment

In First Embodiment, a method of manufacturing, for example, a one-transistor (1T) type ferroelectric memory cell will be described referring to FIGS. 12 to 15. FIGS. 12 to 15 are fragmentary cross-sectional views of a substrate 1S during steps of manufacturing the semiconductor device of the present embodiment.

Figure 12:
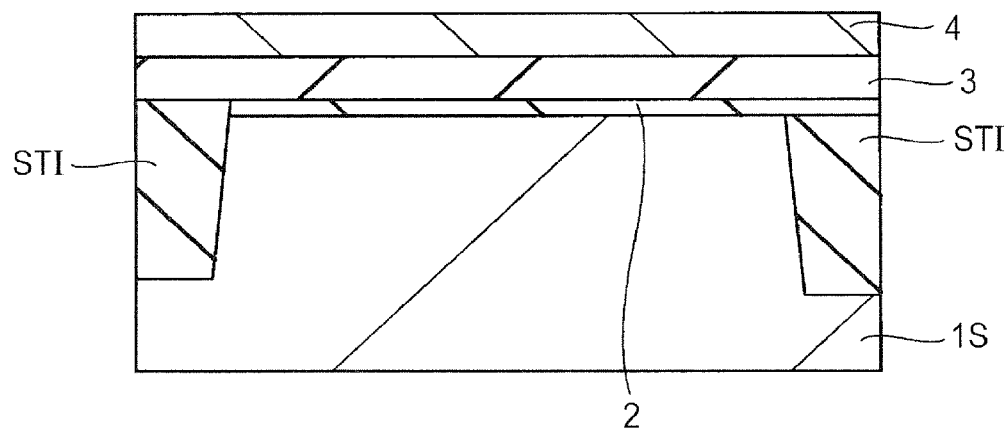
FIG. 12 is a fragmentary cross-sectional view of a semiconductor substrate during a step of manufacturing a semiconductor device according to First Embodiment.

First, as shown in FIG. 12, after formation of, for example, a trench isolation STI in the main surface of the substrate 1S, the substrate 1S is subjected to thermal oxidation treatment or the like to form an insulating film 2 in an active region surrounded with the trench isolation STI. The insulating film 2 is made of, for example, a silicon oxide film and has a thickness of, for example, from about 1 to 2 nm. This insulating film 2 has a function of preventing an electric charge from being trapped at the interface between a hafnium oxide film to be formed later and the substrate 1S. This makes it possible to provide a hafnium oxide film having improved dielectric polarization properties. The insulating film 2 may be made of, for example, a silicon oxynitride (SiON) film. It is to be noted that the substrate 1S to be described below is, for example, a semiconductor wafer which is substantially round in plan view.

Then, the hafnium oxide film 3 is deposited on the main surface (trench isolation STI and insulating film 2) of the substrate 1S, for example, by ALD, CVD, PVD, or the like. The hafnium oxide film 3 after formation is in amorphous phase state and it has a thickness of, for example, about 10 nm. It is to be noted that an impurity such as silicon has not been added to the hafnium oxide film 3.

Then, a cap conductor film 4 is deposited on the hafnium oxide film 3. The cap conductor film 4 is composed mainly of, for example, TiN and has a thickness of, for example, from about 10 to 20 nm. This means that the thickness of the cap conductor film 4 is equal to or more than that of the hafnium oxide film 3.

Figure 13:
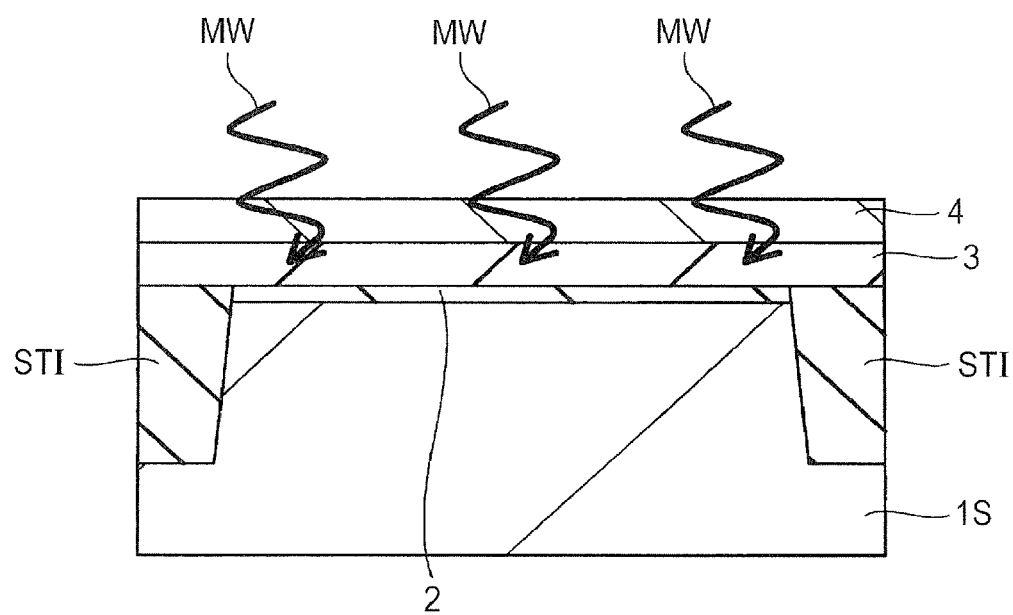
FIG. 13 is a fragmentary cross-sectional view of the semiconductor substrate during the microwave heat treatment in the semiconductor device manufacturing step after FIG. 12.

Next, as shown in FIG. 13, the substrate 1S is exposed to microwaves MW of 2.45 GHz to selectively heat the hafnium oxide film 3 and thereby crystallize the hafnium oxide film 3. Exposure conditions to the microwaves MW are, for example, from 1 to 10 kW and from 1 to 30 minutes. The temperature at the time of heat treatment is, for example, from 300 to 400° C. as a temperature of the back surface of the substrate 1S.

Only the hafnium oxide film 3 can be heated rapidly and uniformly by heating the hafnium oxide film 3 with the microwaves MW. In particular, microwave energy is absorbed by polarized crystals so that crystal nuclei having polarization can be selectively heated. Orthorhombic crystals can therefore be formed efficiently and stably in the crystals of the hafnium oxide film 3. This means that a larger number of orthorhombic crystals can be formed in the crystals of the hafnium oxide film 3. The hafnium oxide film 3 thus formed can therefore exhibit ferroelectric properties.

Further, since the cap conductor film 4 is formed on the hafnium oxide film 3 as described above, a still larger number of orthorhombic crystals can be formed in the hafnium oxide film 3. In particular, by using, as the method of forming a cap conductor film 4, PVD such as RF sputtering at room temperature, formation of the cap insulating film 4 can be performed at a low temperature with less damage so that orthorhombic crystals can be formed in the hafnium oxide film 3 more efficiently and stably. In short, a still larger number of orthorhombic crystals can be formed in the hafnium oxide film 3. The hafnium oxide film 3 thus formed can therefore have ferroelectric properties.

Further, the cap conductor film 4 has a function of imparting the hafnium oxide film 3 with a stress and keeping the state of the orthorhombic crystals in the hafnium oxide film 3. The hafnium oxide film 3 having thereon the cap conductor film 4 can therefore keep the state of the orthorhombic crystals in the crystals of the hafnium oxide film 3 even after another heat treatment is performed after crystallization of the hafnium oxide film 3. The hafnium oxide film 3 can therefore keep its ferroelectric properties.

Figure 14:
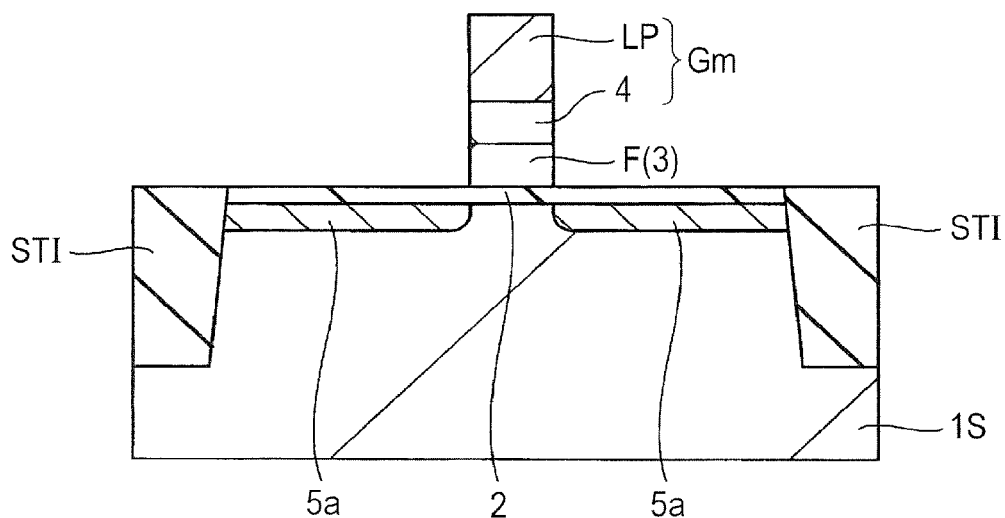
FIG. 14 is a fragmentary cross-sectional view of the semiconductor substrate during a semiconductor device manufacturing step after FIG. 13.

Then, after deposition of a polycrystalline silicon film (not illustrated) having, for example, a thickness of from about 50 nm to 100 nm on the cap conductor film 4, an impurity is introduced into the polycrystalline film by ion implantation or the like. Then, the resulting polycrystalline film is patterned using lithography and etching and the cap conductor film 4 and the hafnium oxide film 3 therebelow are also patterned to form a gate electrode Gm and a ferroelectric film F as shown in FIG. 14. The gate electrode Gm is comprised of a stacked film of the cap conductor film 4 and a low-resistance polycrystalline silicon film LP and the ferroelectric film F is made of the hafnium oxide film 3. Then, a predetermined impurity is ion implanted into the main surface of the substrate 1S with the gate electrode Gm as a mask to form, in the main surface of the substrate 1S, lightly-doped semiconductor regions 5a and 5a in self alignment with the gate electrode Gm.

Figure 15:
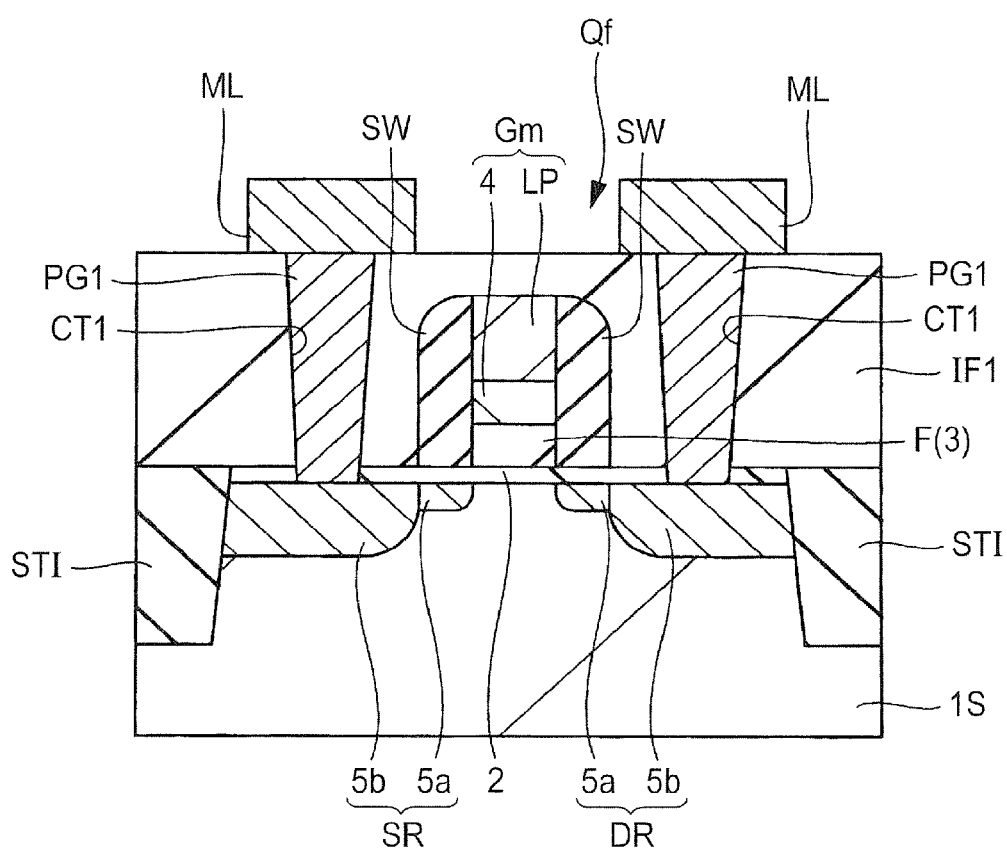
FIG. 15 is a fragmentary cross-sectional view of the semiconductor substrate during a semiconductor device manufacturing step after FIG. 14.

Next, as shown in FIG. 15, after formation of a sidewall spacer SW made of, for example, a silicon oxide film on the side surface of the gate electrode Gm, a predetermined impurity is ion implanted into the main surface of the substrate 1S with the gate electrode Gm and the sidewall spacer SW as a mask to form, in the main surface of the substrate 1S, heavily-doped semiconductor regions 5b and 5b in self alignment with the gate electrode Gm and the sidewall spacer SW. The lightly-doped semiconductor region 5a and the heavily-doped semiconductor region 5b thus obtained configure each of a source region SR and a drain region DR. Thus, a ferroelectric gate field effect transistor (which will hereinafter be abbreviated as FeFET) Qf is formed which configures the 1T-type ferroelectric memory cell.

Then, after deposition of an interlayer insulating film IF1 made of, for example, a silicon oxide film on the main surface of the substrate 1S by CVD or the like, contact holes CT1 reaching the source region SR and drain region DR, respectively, are formed in the interlayer insulating film IF1. Then, a conductor film is formed by depositing, for example, tungsten on the interlayer insulating film IF1 by sputtering or the like to fill the contact holes CT1 therewith. The resulting conductor film is subjected to CMP (chemical mechanical polishing) treatment to form a plug PG1 in the contact holes CT1. A metal film is then formed by depositing, for example, aluminum on the interlayer insulating film IF1 and the metal film is patterned into a wiring ML by lithography and etching.

According to First Embodiment, the hafnium oxide film 3 exhibiting ferroelectric properties can be provided because orthorhombic crystals can be formed efficiently and stably in the crystals of the hafnium oxide film 3 configuring the ferroelectric film F of the FeFET Qf and a larger number of orthorhombic crystals can be formed in the crystals of the hafnium oxide film 3. Accordingly, 1T type FeFETQf can be formed.

A hafnium oxide film having a reverse size effect can be used as the ferroelectric film of the FeFET Qf so that miniaturization of the FeFET Qf can be achieved. This can improve the integration degree of the FeFET Qf.

In addition, the FeFET Qf can have a prolonged lifetime because the hafnium oxide film 3, which is a film for configuring the ferroelectric film F of the FeFET Qf, can maintain its ferroelectric properties after heat treated with microwaves.

Figure 16:
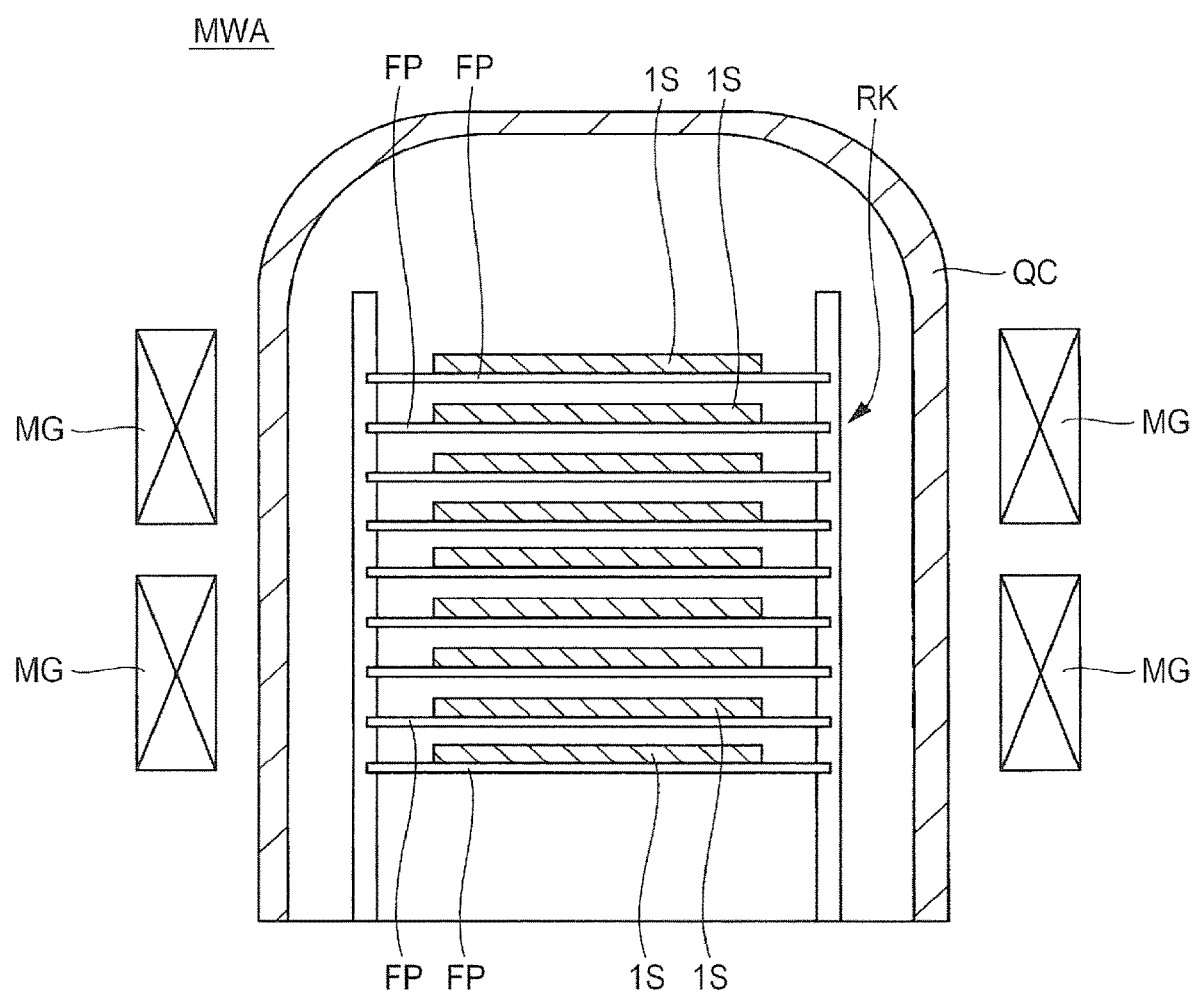
FIG. 16 is a block diagram showing one example of a microwave heating apparatus used in the microwave heating step which is one of the steps of manufacturing the semiconductor device according to First Embodiment.

Next, FIG. 16 is a block diagram showing one example of a microwave heating apparatus used in the microwave heating step which is one of the steps of manufacturing the semiconductor device of the present embodiment.

The microwave heating apparatus MWA is a batch type microwave annealing apparatus for heat treating, for example, a plurality of the substrates 1S collectively with microwaves. A container QC configuring this microwave heating apparatus MWA is comprised of, for example, a quartz chamber containing quartz and it is equipped with a rack RK. This rack RK has a plurality of mounting plates FP along the direction of the height of the rack RK. The substrate 1S is mounted on each of the mounting plates FP with its main surface upside. Each mounting plate FP is equipped with, for example, a thermocouple as a temperature sensor for detecting the temperature of the substrate 1S. This thermocouple is placed while being brought into contact with the back surface of the substrate 1S.

On the other hand, the container Qc has, on the outside thereof, a magnetron MG that surrounds the periphery of the container QC. The magnetron MG is an apparatus which generates microwaves of, for example, 2.45 GHz to expose thereto a plurality of the substrates 1S in the container QC and selectively heat the hafnium oxide film 3 on each of the substrates 1S. The microwaves used here are required to have a frequency at which the hafnium oxide film 3 absorbs microwave energy efficiently (frequency at which polarization oscillation occurs) and from this standpoint, the frequency can be changed within a range of, for example, from 1 GHz to 10 GHz. Within this frequency range, the frequency permitted to use freely under the Radio Act is, for example, 2.45 GHz or 5.8 GHz. Either of these frequencies is preferred because it can be used without installing any special electromagnetic wave shield equipment or the like.

Here, the using example of the batch type microwave heating apparatus is described above, but the heating apparatus is not limited thereto but a single-substrate (continuous) microwave heating apparatus that processes the substrates 1S one by one may be used. As the microwave generating apparatus, magnetron is used, but not only it but also various ones can be used. For example, another microwave generating apparatus such as klystron may be used.

Second Embodiment

In Second Embodiment, a method of manufacturing, for example, a 1-transistor 1-capacitor (1T1C) type ferroelectric memory cell will be described referring to FIGS. 17 to 20. FIGS. 17 to 20 are fragmentary cross-sectional views of the substrate 1S during the steps of manufacturing a semiconductor device of Second Embodiment.

Figure 17:
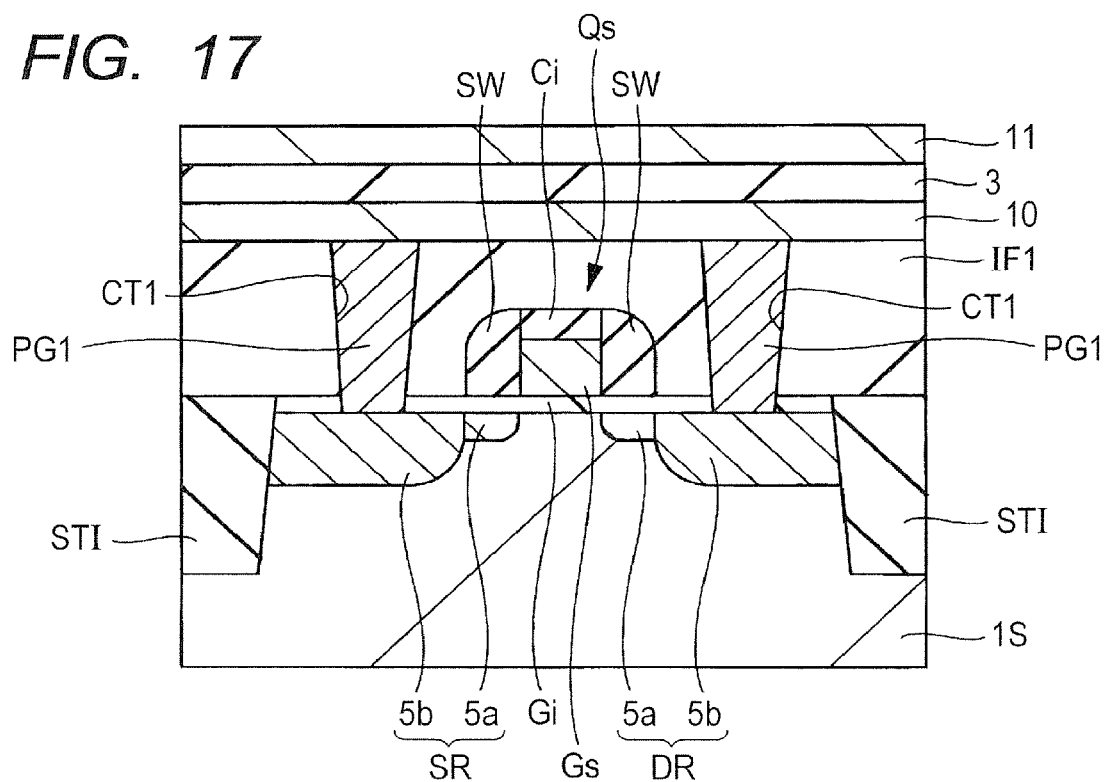
FIG. 17 is a fragmentary cross-sectional view of a semiconductor substrate during a step of manufacturing a semiconductor device according to Second Embodiment.

First, as shown in FIG. 17, a conventional select field effect transistor (which will hereinafter be called "select MOSFET") Qs is formed in an active region surrounded with an isolation trench STI on the main surface of a substrate 1S. The gate electrode Gs of the select MOSFET Qs is made of, for example, a low-resistance polycrystalline film and a gate insulating film Gi is formed between the bottom surface thereof and the substrate 1S. The gate insulating film Gi is made of, for example, a silicon oxide film and is formed by thermal oxidation of the substrate 1S. The gate electrode Gs has, on the upper surface thereof, a cap insulating film Ci made of, for example, a silicon oxide film or a silicon nitride film.

Then, as described above, after deposition of an interlayer insulating film IF1 on the substrate 1S, formation of a contact hole CT1, and formation of a plug PG1, a lower-electrode conductor film (first conductor film) 10 composed mainly of, for example, TiN is deposited by sputtering or the like on the interlayer insulating film IF1.

Then, for example, a hafnium oxide film 3 is deposited on the lower electrode conductor film 10 in a manner similar to that of First Embodiment. The hafnium oxide film 3 after formation is in amorphous phase state and it has a thickness of, for example, about 10 nm. It is to be noted that an impurity such as silicon has not been added to the hafnium oxide film 3.

Then, in a manner similar to that of the cap conductor film 4 in First Embodiment, an upper electrode conductor film (second conductor film) 11 composed mainly of, for example, TiN is deposited. This conductor film 11 has a function similar to that of the cap conductor film 4 and has a thickness equal to or more than that of the hafnium oxide film 3, more specifically, from about 10 nm to 20 nm.

Figure 18:
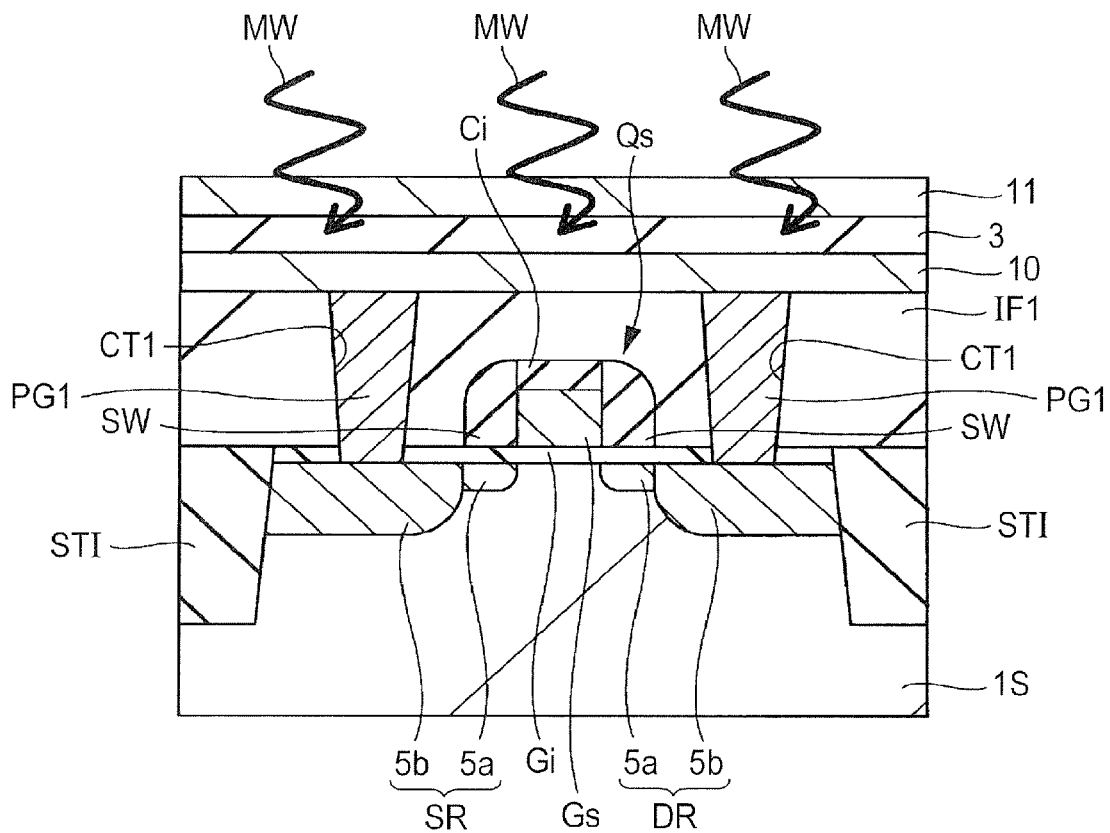
FIG. 18 is a fragmentary cross-sectional view of the semiconductor substrate during microwave heat treatment which is a semiconductor device manufacturing step after FIG. 17.

Then, as shown in FIG. 18, the hafnium oxide film 3 between the conductor films 10 and 11 is selectively heated by exposing the substrate 1S to microwaves MW of, for example, 2.45 GHz to crystallize the hafnium oxide film 3. The exposure conditions to the microwaves MW and heat treatment temperature are equal to those of First Embodiment. A microwave heating apparatus to be used for the microwave heat treatment is also the same as that described in First Embodiment referring to FIG. 16.

In Second Embodiment similar to First Embodiment, since orthorhombic crystals can be formed efficiently and stably in the crystals of the hafnium oxide film 3 and a larger number of orthorhombic crystals can be formed in the crystals of the hafnium oxide film 3, the hafnium oxide film 3 thus obtained can exhibit ferroelectric properties.

Further, since the upper electrode conductor film 11 is formed on the hafnium oxide film 3 as described above, a still larger number of orthorhombic crystals can be formed in the hafnium oxide film 3. In particular, by using PVD such as RF sputtering at room temperature for the formation of the upper electrode conductor film 11, the conductor film 11 can be formed at a low temperature with less damage so that orthorhombic crystals can be formed in the hafnium oxide film 3 more efficiently and stably and a still larger number of orthorhombic crystals can be formed in the hafnium oxide film 3. The hafnium oxide film 3 thus formed can therefore have ferroelectric properties.

Further, the upper electrode conductor film 11 has, similar to the cap conductor film 4, a function of keeping the state of the orthorhombic crystals in the hafnium oxide film 3. The hafnium oxide film 3 having thereon the conductor film 11 can therefore keep the state of the orthorhombic crystals in the crystals of the hafnium oxide film 3 even after another heat treatment is performed after crystallization of the hafnium oxide film 3. The hafnium oxide film 3 can therefore keep its ferroelectric properties.

In a ferroelectric memory cell having a capacitor, a select MOSEFT Qs is formed on the substrate 1S prior to the formation of the capacitor. High-temperature heat treatment at the time of forming the capacitor therefore diffuses the impurity in the source region SR or drain region DR of the select MOSFET Qs and the select MOSFET Qs thus obtained may have deteriorated electrical properties or reliability. Moreover, an increase in the size of the select MOSFET Qs to ensure the electrical properties or reliability of the select MOSFET Qs is contrary to the object of the invention to achieve miniaturization. In the present embodiment, on the other hand, an influence of heat on the select MOSFET Qs as described above can be reduced because the hafnium oxide film 3 of the capacitor can be formed at a relatively low temperature (for example, from 300 to 400° C.) and in addition, it can be heated selectively because of microwaves used. This means that the select MOSFET Qs having improved electrical properties and reliability can be provided. In addition, a miniaturized select MISFET Qs can be formed so that the integration degree of the ferroelectric memory cell can be improved.

Figure 19:
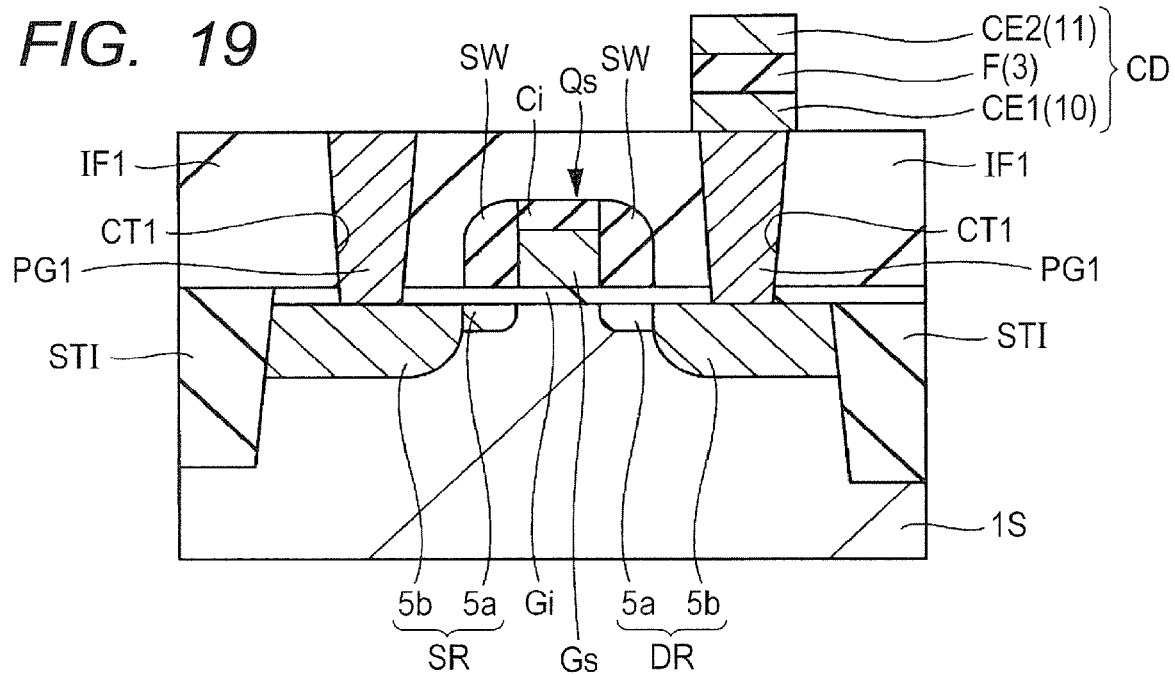
FIG. 19 is a fragmentary cross-sectional view of the semiconductor substrate during a semiconductor device manufacturing step after FIG. 18.

Then, as shown in FIG. 19, the conductor film 10, the hafnium oxide film 3, and the conductor film 11 are patterned by lithography and etching to form a capacitor CD of the ferroelectric memory cell. The capacitor CD is a stacked film of a lower electrode CE1, a ferroelectric film F, and an upper electrode CE2. The lower electrode CE1 is made of the conductor film 10 and the upper electrode CE2 is made of the conductor film 11. The ferroelectric film F is made of the hafnium oxide film 3 having ferroelectric properties.

Figure 20:
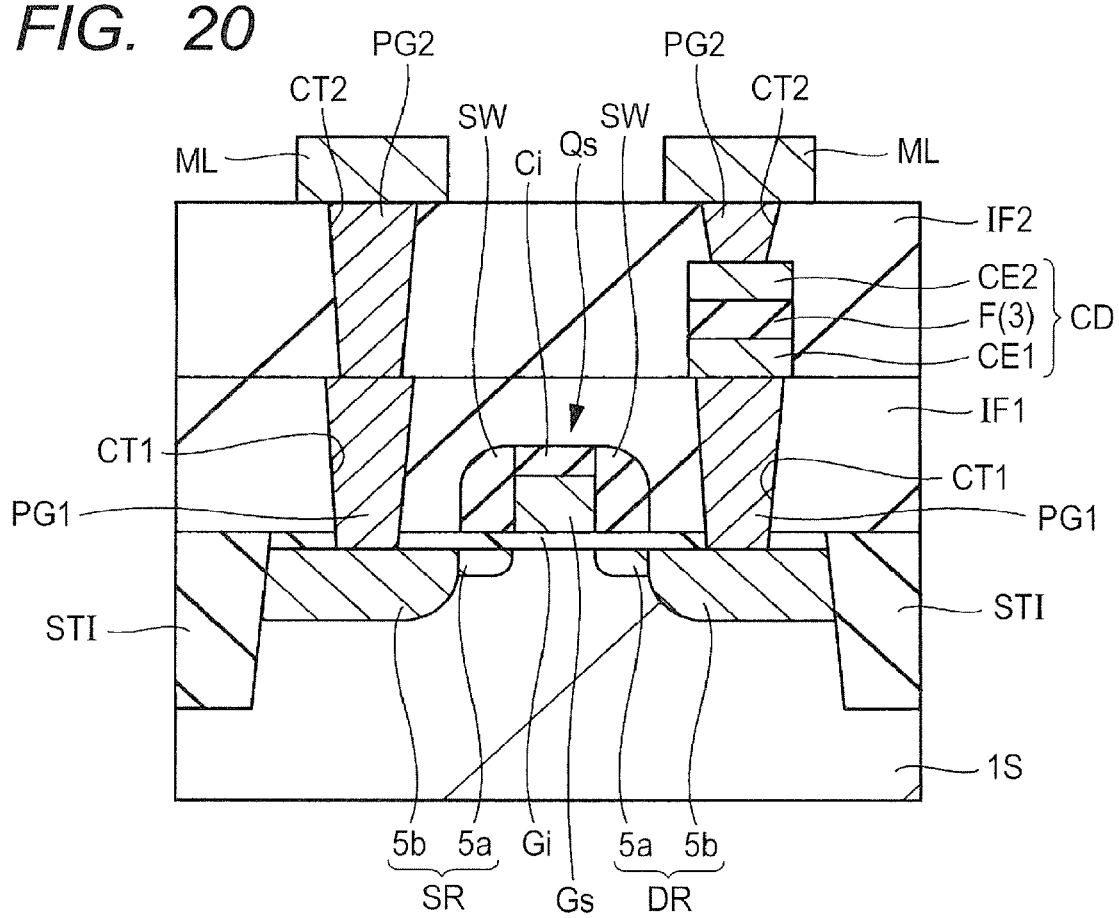
FIG. 20 is a fragmentary cross-sectional view of the semiconductor substrate during a semiconductor device manufacturing step after FIG. 19.

Then, as shown in FIG. 20, after formation of an interlayer insulating film IF2 made of, for example, a silicon oxide film on the main surface of the substrate 1S, contact holes CT2 reaching the upper electrode CE2 of the capacitor CD and the plug PG1 are formed, respectively, in the interlayer insulating film IF2. Then, as in the formation of the plug PG1, a plug PG2 made of, for example, a conductor film such as tungsten is formed in the contact holes CT2. As in First Embodiment, a wiring ML is then formed on the interlayer insulating film IF2.

According to Second Embodiment, orthorhombic crystals can be formed efficiently and stably in the crystals of the hafnium oxide film 3 configuring the ferroelectric film F of the capacitor CD of the 1T1C type ferroelectric memory cell and a larger number of orthorhombic crystals can be formed in the crystals of the hafnium oxide film 3. The hafnium oxide film 3 thus obtained can therefore exhibit ferroelectric properties. Accordingly, the 1T1C type ferroelectric memory cell can be formed.

A hafnium oxide film having a reverse size effect can be used as the ferroelectric film of the capacitor CD of the 1T1C type ferroelectric memory cell so that miniaturization of the capacitor CD can be achieved. This can improve the integration degree of the 1T1C type ferroelectric memory cell.

In addition, the 1T1C type ferroelectric memory cell can have a prolonged lifetime because the hafnium oxide film 3, which is a film for configuring the ferroelectric film F of the capacitor CD of the 1T1C type ferroelectric memory cell, can maintain its ferroelectric properties by being heat treated with microwaves.

Further, the hafnium oxide film 3 configuring the ferroelectric film F of the capacitor CD can be heated at a relatively low temperature with microwaves and at the same time, can be heated selectively so that the select MOSFET Qs configuring the ferroelectric memory cell can have improved electrical properties or improved reliability. In addition, the select MISFET Qs configuring the ferroelectric memory cell can be provided as a miniaturized one, leading to improvement in the integration degree of the 1T1C type ferroelectric memory cell.

Third Embodiment

In Third Embodiment, a method of manufacturing a semiconductor device in the case where a 1T type ferroelectric memory cell is comprised of, for example, a fin type transistor will be described referring to FIGS. 21 to 30. FIGS. 21 to 30 are fragmentary cross-sectional views of a substrate 1S during steps of manufacturing the semiconductor device of Third Embodiment. The right-side cross-sectional view in FIGS. 21 to 30 is a cross-sectional view that intersects (is orthogonal to) the left-side cross-sectional view at the center position of the left-side cross-sectional view.

Figure 21:
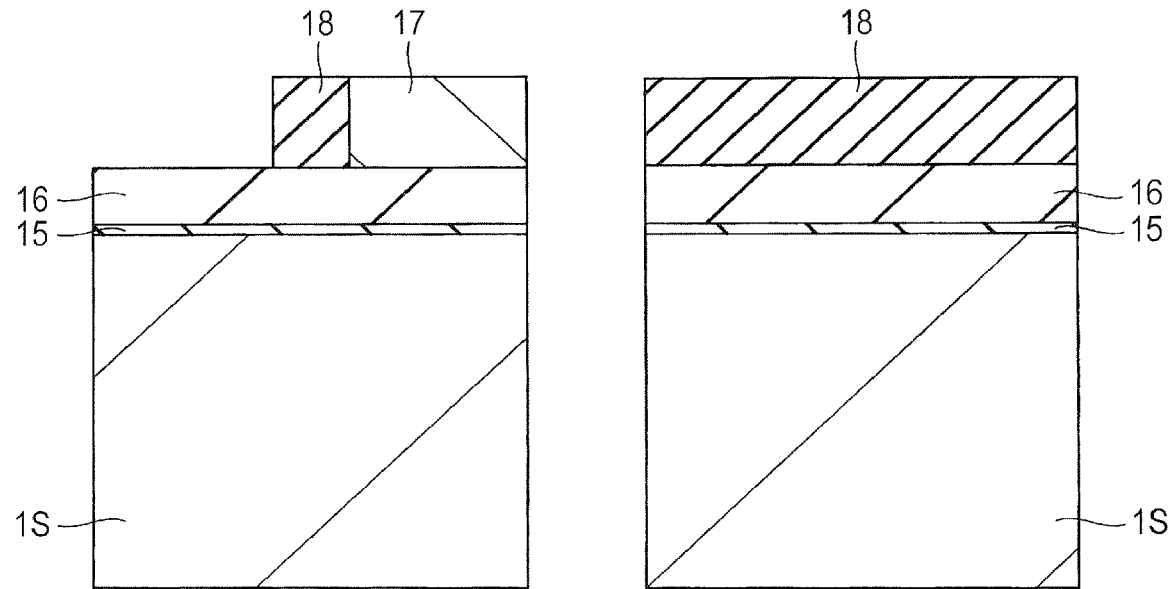
FIG. 21 is a fragmentary cross-sectional view of a semiconductor substrate during a step of manufacturing a semiconductor device according to Third Embodiment.

First, as shown in FIG. 21, an insulating film 15 is formed on the main surface of the substrate 1S by thermal oxidation treatment or the like of the substrate 1S. The insulating film 15 is made of, for example, a silicon oxide film and has a thickness of, for example, from about 2 to 10 nm. Then, an insulating film 16 is deposited on the insulating film 15 by CVD or the like. The insulating film 16 is made of, for example, a silicon nitride film and has a thickness of, for example, from about 20 to 100 nm. Then, after deposition of an amorphous silicon film on the insulating film 16 by CVD or the like, the amorphous silicon film is patterned into a desired shape by lithography and etching to form a dummy pattern 17. This dummy pattern 17 has a thickness of, for example, from about 20 to 200 nm.

Figure 22:
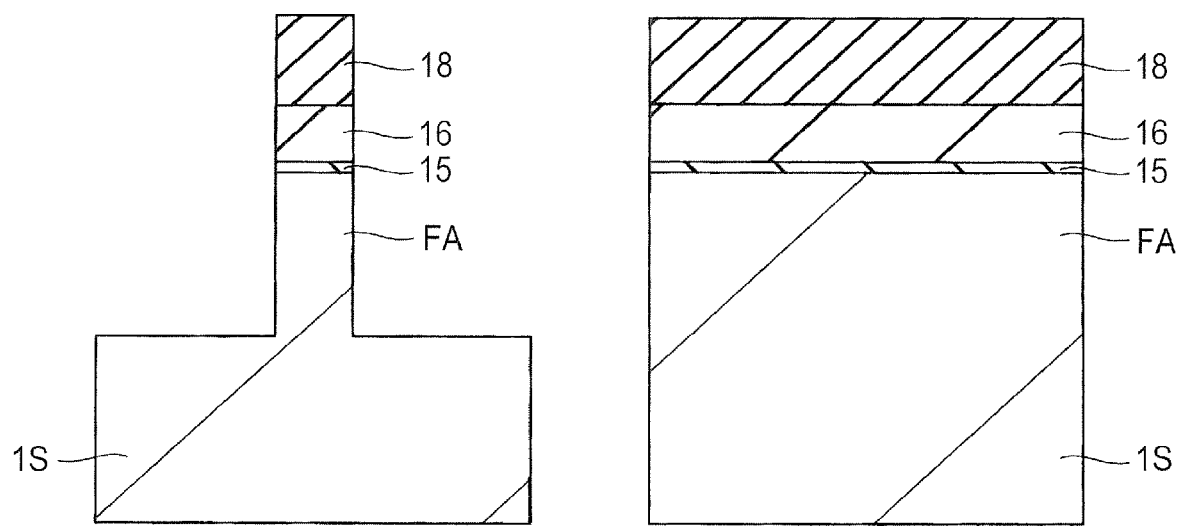
FIG. 22 is a fragmentary cross-sectional view of the semiconductor substrate during a semiconductor device manufacturing step after FIG. 21.

Next, a silicon oxide film having a thickness of, for example, from about 10 to 40 nm is deposited on the main surface of the substrate 1S by CVD or the like to cover the upper surface and the side surface of the dummy pattern 17. The resulting silicon oxide film is anisotropically dry etched to form a hard mask 18 on the side wall of the dummy pattern 17. The hard mask film 18 has a width (short-direction size on the left drawing in FIG. 21) of, for example, from 10 to 40 nm. This width of the hard mask 18 will be a width of a fin which will be described later. Then, after removal of the dummy pattern 17, with the remaining portion of the hard mask film 18 as an etching mask, the insulating films 16 and 15 and the substrate 1S are anisotropically dry etched to remove, by etching, a portion of the insulating films 16 and 15 and the substrate 1S exposed from the hard mask film 18 as shown in FIG. 22. By this removal, the insulating films 16 and 15 and a fin (protrusion) FA having a shape equal to that of the hard mask film 18 in plan view are formed. The fin FA is made of a portion of the substrate 1S and protrudes from the main surface of the substrate 1S. By digging the substrate 1S in a region exposed from the hard mask 18, for example, by from 100 to 250 nm, a fin FA having a height of, for example, from 100 to 250 nm from the main surface of the substrate 1S can be formed. After the fin FA is formed, the hard mask 18 is removed.

Figure 23:
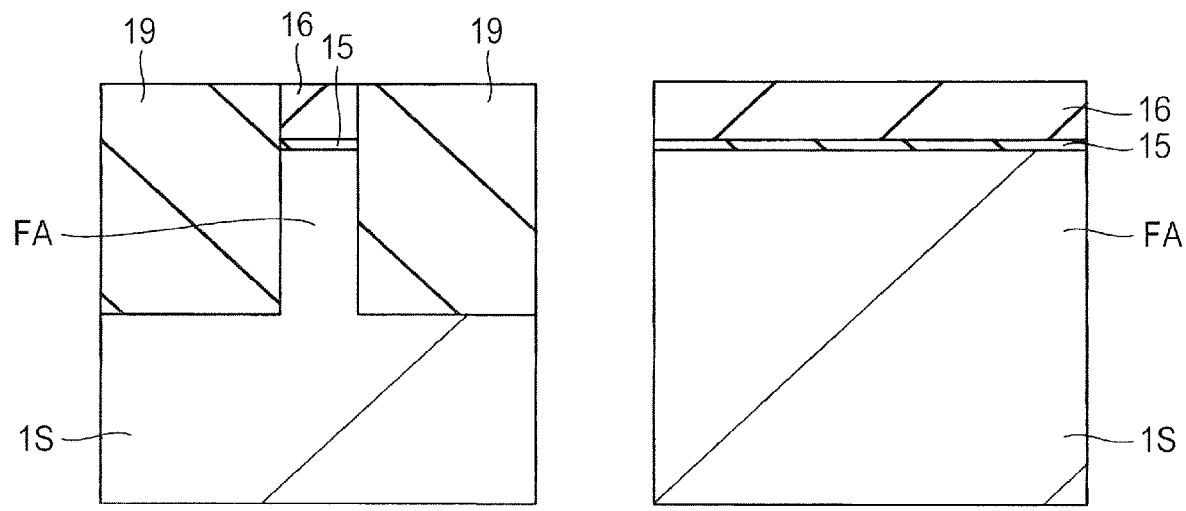
FIG. 23 is a fragmentary cross-sectional view of the semiconductor substrate during a semiconductor device manufacturing step after FIG. 22.

Next, as shown in FIG. 23, after deposition of an insulating film 19 made of, for example, a silicon oxide film on the main surface of the substrate 1S, the resulting insulating film 19 is subjected to CMP treatment and this CMP treatment is terminated at the time when the upper surface of the insulating film 16 is exposed. The insulating film 19 is formed on the main surface of the substrate 1S to fill between any two of the fins FA adjacent to each other. Then, the insulating films 16 and 15 are removed successively.

Figure 24:
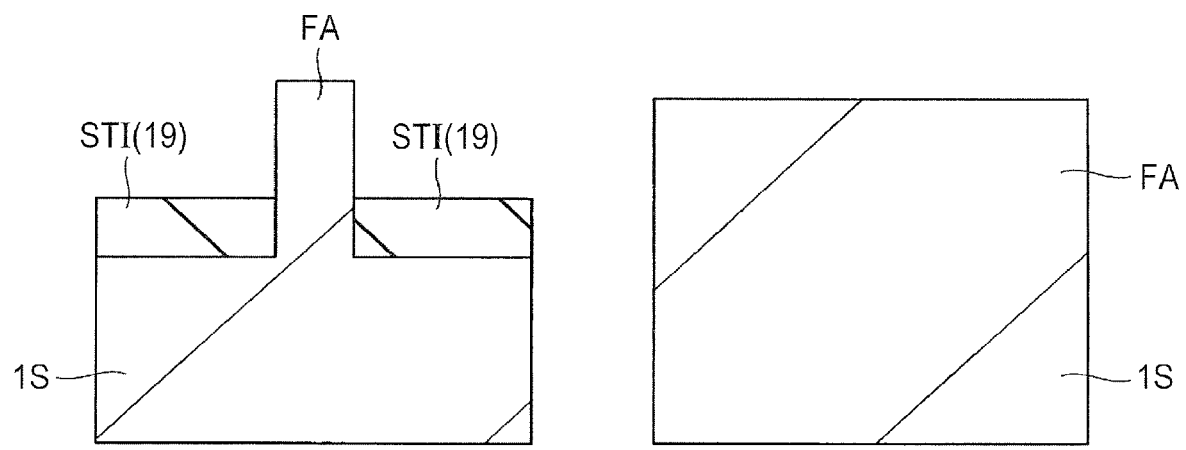
FIG. 24 is a fragmentary cross-sectional view of the semiconductor substrate during a semiconductor device manufacturing step after FIG. 23.

Then, the insulating film 19 is subjected to etching treatment to remove an upper portion of the insulating film 19 and reduce (retreat) the main surface height of the insulating film 19 as show in FIG. 24. A portion of the surface (main surface and side surface intersecting therewith) of the fin FA is thus exposed from the insulating film 19 and at the same time, an isolation trench STI made of the insulating film 19 is formed around the leg portion of the fin FA.

Figure 25:
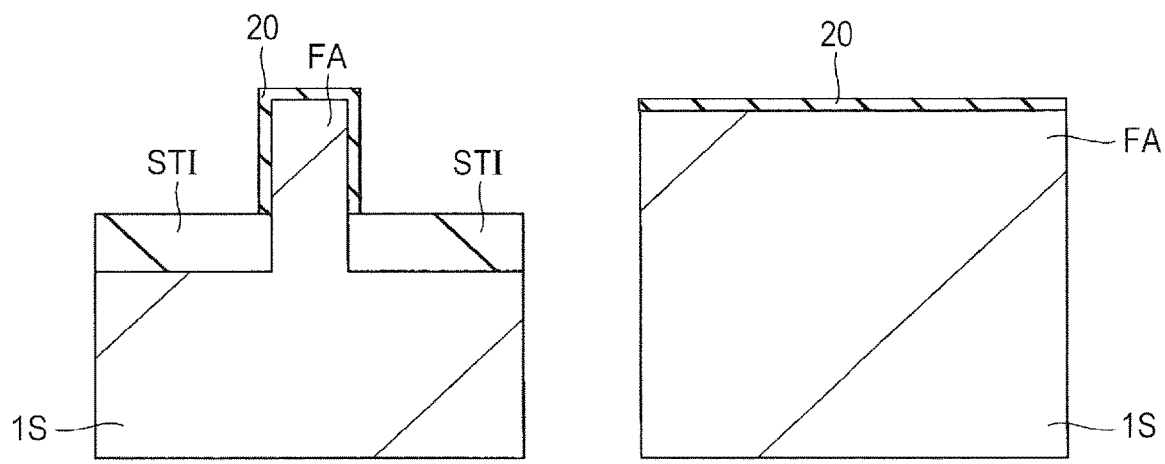
FIG. 25 is a fragmentary cross-sectional view of the semiconductor substrate during a semiconductor device manufacturing step after FIG. 24.

Next, an insulating film (second insulating film) 20 is formed on the exposed surfaces (main surface and side surface) of the fin FA as shown in FIG. 25 by subjecting the substrate 1S to thermal oxidation treatment. The insulating film 20 is made of, for example, a silicon oxide film and has a thickness of, for example, from about 1 to 2 nm. The insulating film 20 may be made of, for example, a silicon oxynitride (SiON) film.

Figure 26:
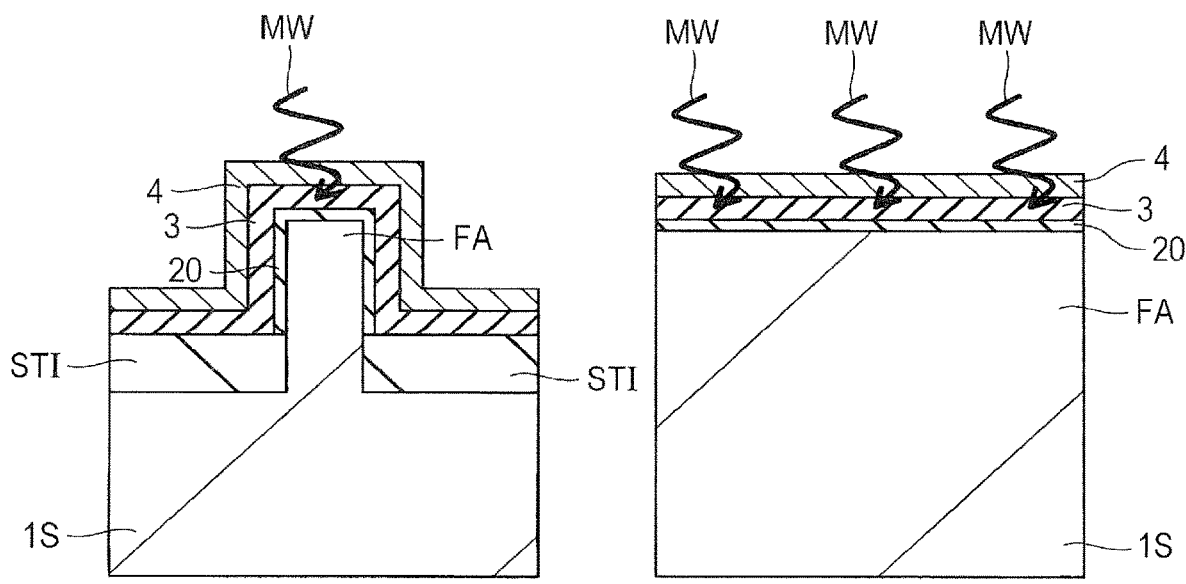
FIG. 26 is a fragmentary cross-sectional view of the semiconductor substrate during microwave heat treatment which is a semiconductor device manufacturing step after FIG. 25.

Then, as shown in FIG. 26, as in First Embodiment, a hafnium oxide film 3 having a thickness of, for example, about 10 nm is deposited on the main surface of the substrate 1S. Also in this case, an impurity such as silicon has not been added to the hafnium oxide film 3. Then, as in First Embodiment, a cap conductor film 4 made of, for example, a titanium nitride film having a thickness of from about 10 to 20 nm is deposited on the hafnium oxide film 3.

Next, the substrate 1S is exposed to, for example microwaves MW of 2.45 GHz to selectively heat the hafnium oxide film 3 and crystallize the hafnium oxide film 3. Exposure conditions to the microwaves MW and the heat treatment temperature are equal to those of First Embodiment. A microwave heating apparatus used in the microwave heat treatment is the same as that described referring to FIG. 16 in First Embodiment.

Also in Third Embodiment similar to First Embodiment, orthorhombic crystals can be formed in the crystals of the hafnium oxide film 3 efficiently and stably and a larger number of orthorhombic crystals can be formed in the crystals of the hafnium oxide film 3. The hafnium oxide film 3 thus obtained can therefore exhibit ferroelectric properties.

As in First Embodiment, since the hafnium oxide film 3 has thereon the cap conductor film 4, a still larger number of orthorhombic crystals can be formed in the hafnium oxide film 3. In particular, by using, as the method of forming the cap conductor film 4, PVD such as RF sputtering at room temperature, the cap insulating film 4 can be formed at a low temperature with less damage so that orthorhombic crystals can be formed in the hafnium oxide film 3 more efficiently and stably and a still larger number of orthorhombic crystals can be formed in the hafnium oxide film 3. The hafnium oxide film 3 thus formed can therefore exhibit ferroelectric properties.

The hafnium oxide film 3 having thereon the cap conductor film 4 as in First Embodiment can therefore keep the state of the orthorhombic crystals in the crystals of the hafnium oxide film 3 even after another heat treatment is performed after crystallization of the hafnium oxide film 3. The hafnium oxide film 3 can therefore keep its ferroelectric properties.

Figure 27:
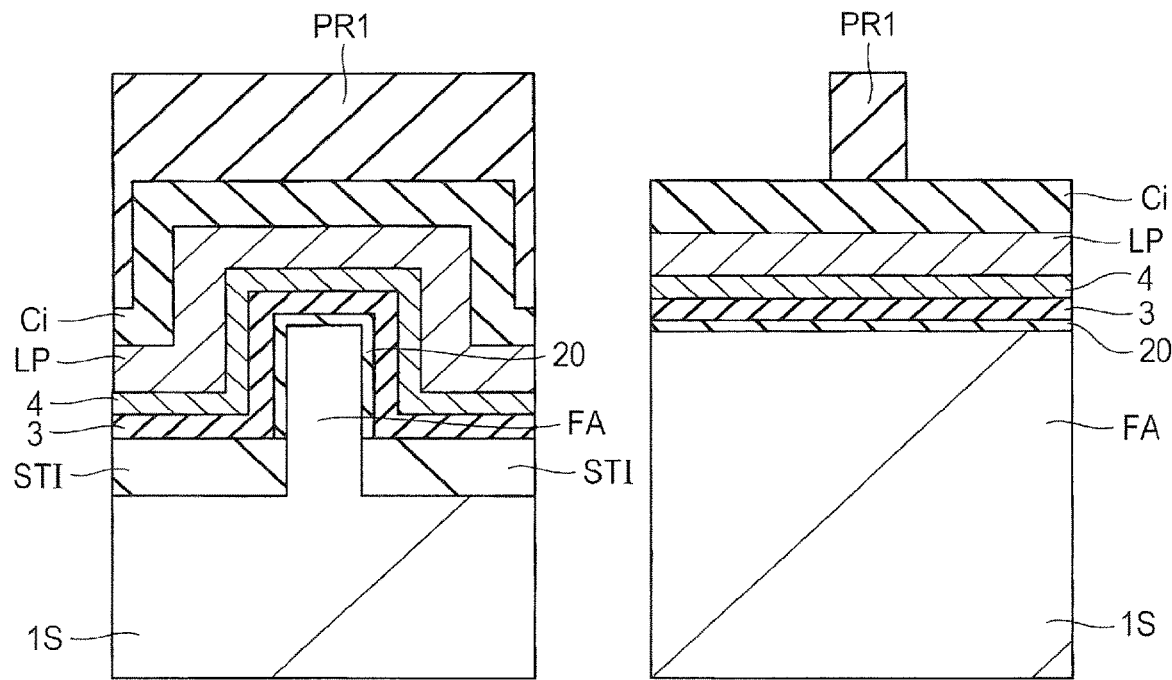
FIG. 27 is a fragmentary cross-sectional view of the semiconductor substrate during a semiconductor device manufacturing step after FIG. 26.

Then, as shown in FIG. 27, after deposition of a polycrystalline silicon film LP having, for example, a thickness of from about 50 nm to 100 nm on the cap conductor film 4 by CVD or the like, an impurity is introduced into the polycrystalline silicon film LP by ion implantation or the like. After deposition of a cap insulating film Ci made of, for example, a silicon oxide film on the polycrystalline silicon film LP by CVD or the like, a resist pattern PR1 is formed on the cap insulating film Ci by lithography.

Figure 28:
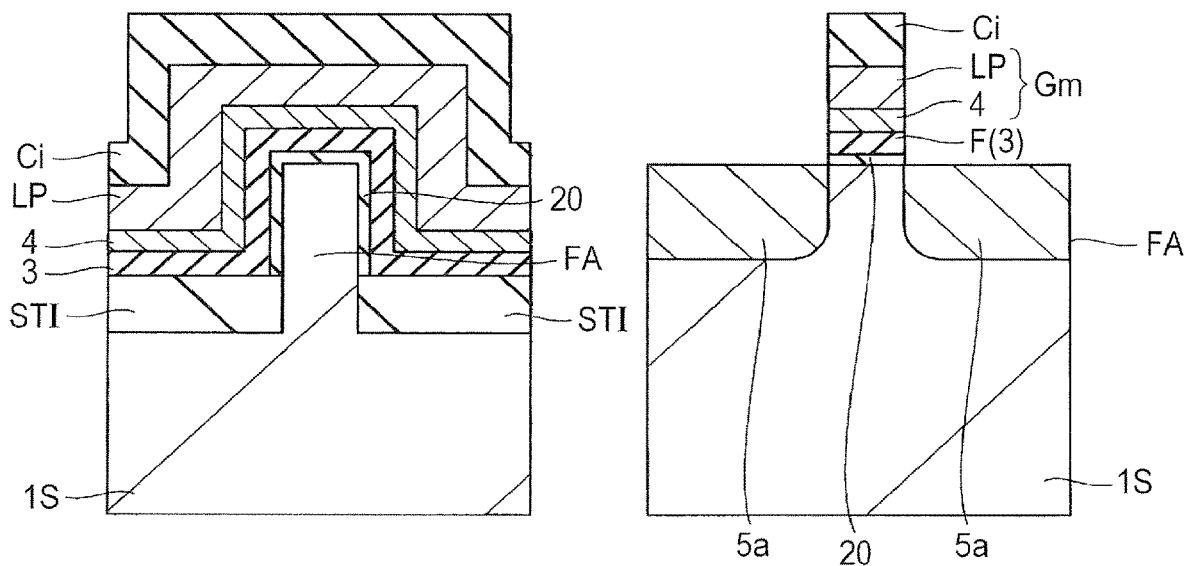
FIG. 28 is a fragmentary cross-sectional view of the semiconductor substrate during a semiconductor device manufacturing step after FIG. 27.

Then, as shown in FIG. 28, the cap insulating film Ci, the polycrystalline silicon film LP, the cap conductor film 4, the hafnium oxide film 3, and the insulating film 20 are patterned with the resist pattern PR1 as an etching mask to form a gate electrode Gm and a ferroelectric film F. The gate electrode Gm is comprised of a stacked film of the cap conductor film 4 and the low-resistance polycrystalline silicon film LP. The ferroelectric film F is made of the hafnium oxide film 3.

Then, with the gate electrode Gm as a mask, a predetermined impurity is ion-implanted into the main surface of the substrate 1S to form lightly-doped semiconductor regions 5a and 5a in the fin FA of the substrate 1S in self alignment with the gate electrode Gm.

Figure 29:
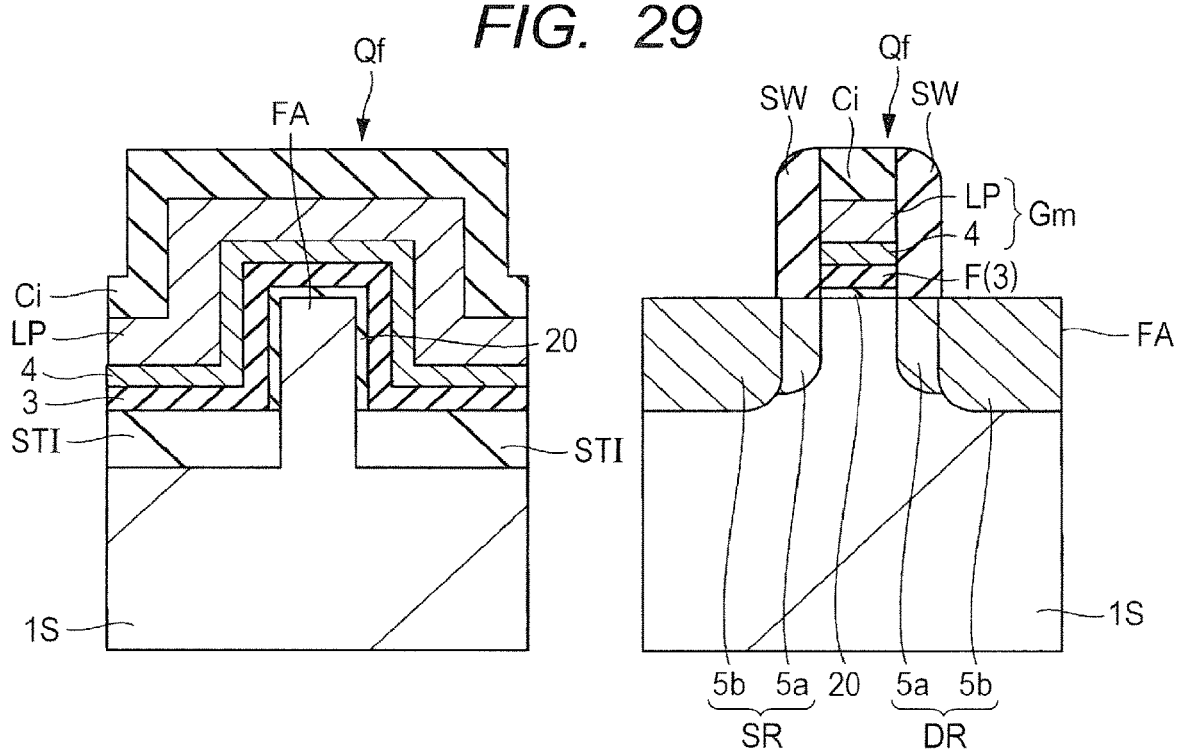
FIG. 29 is a fragmentary cross-sectional view of the semiconductor substrate during a semiconductor device manufacturing step after FIG. 28.

Next, as shown in FIG. 29, after formation of a sidewall spacer SW on the side surface of the gate electrode Gm, a predetermined impurity is ion-implanted into the main surface of the substrate 1S with the gate electrode Gm and the sidewall spacer SW as a mask. Heavily-doped semiconductor regions 5b and 5b are thus formed in the fin FA in self alignment with the gate electrode Gm and the sidewall spacer SW. The lightly-doped semiconductor region 5a and the heavily-doped semiconductor region 5b thus obtained configure each of a source region SR and a drain region DR. In such a manner, a fin type FeFET Qf configuring a 1T type ferroelectric memory cell is formed.

Figure 30:
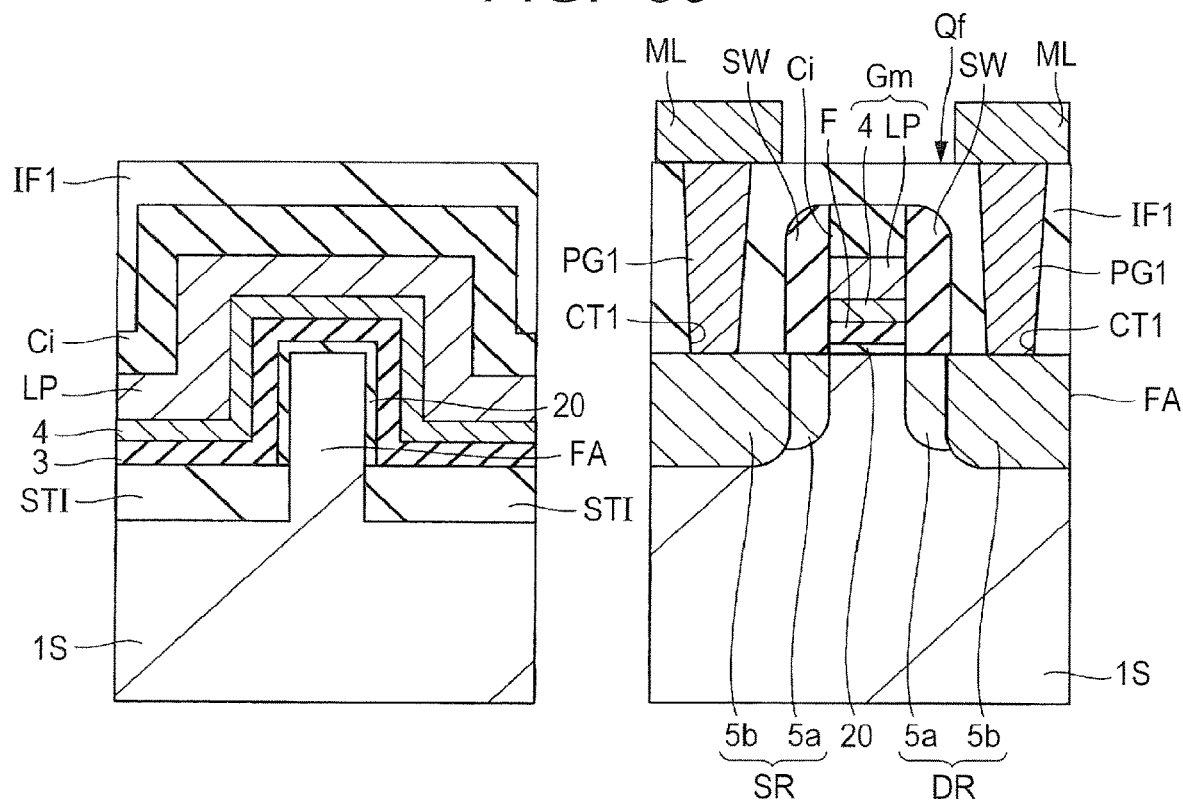
FIG. 30 is a fragmentary cross-sectional view of the semiconductor substrate during a semiconductor device manufacturing step after FIG. 29.

Then, as shown in FIG. 30, as in First Embodiment, an interlayer insulating film IF1 is deposited on the main surface of the substrate 1S; a contact hole CT1 is formed in the interlayer insulating film IF1; a plug PG1 is formed in the contact hole CT1, and a wiring ML is formed on the interlayer insulating film IF1.

According to Third Embodiment, similar to First Embodiment, the hafnium oxide film 3 configuring the ferroelectric film F of the fin type FeFET Qf can exhibit ferroelectric properties. The fin type FeFET Qf can therefore be formed.

A hafnium oxide film having a reverse size effect can be used as the ferroelectric film F of the fin type FeFET Qf so that the fin type FeFET Qf can be provided as a miniaturized one, leading to improvement in the integration degree of the FeFET Qf.

In addition, the fin type FeFET Qf can have a prolonged lifetime because the hafnium oxide film 3, which is a film for configuring the ferroelectric film F of the fin type FeFET Qf, can maintain its ferroelectric properties by being heat treated with microwaves.

The invention made by the present inventors has been described specifically based on its embodiments. It is needless to say that the invention is not limited to the above-described embodiments but can be changed in various ways without departing from the gist of the invention.

For example, in First to Third Embodiments, the hafnium oxide film 3 is heated with microwaves after deposition of the cap conductor film 4 or conductor film 11. Alternatively, as described above, after formation of the hafnium oxide film 3 and before deposition of the cap conductor film 4 or conductor film 11, the hafnium oxide film 3 may be selectively heated with microwaves. In the latter case, similar to the above-described one, a larger number of orthorhombic crystals can be formed in the crystals of the hafnium oxide film 3 so that the hafnium oxide film 3 thus obtained can exhibit ferroelectric properties.

In First to Third Embodiments, at least any one of impurity elements selected from Si, Zr, nitrogen (N), carbon (C), and fluorine (F) having a crystal nucleus of orthorhombic crystals may be added to the hafnium oxide film 3 by ion implantation or the like before heating of the hafnium oxide film 3 by microwaves. This makes it possible to form orthorhombic crystals in the crystals of the hafnium oxide film 3 more efficiently and stably compared with formation only by microwave heating. In other words, a larger number of orthorhombic crystals can be formed in the crystals of the hafnium oxide film 3 so that the hafnium oxide film 3 thus obtained can exhibit ferroelectric properties.

In First to Third Embodiments, formation of a ferroelectric film using a hafnium oxide film has been described. Not limited to it, but also a ferroelectric film may be formed using, for example, a zirconium oxide film (metal oxide film) or a metal oxide film composed mainly of a Hf-Zr mixture and O.

When the zirconium oxide film is used, for example, at least any one of impurity elements selected from Si, Hf, N, C, and F having a crystal nucleus of orthorhombic crystals may be added to the zirconium oxide film, which has not yet been heated with microwaves, by ion implantation or the like.

When the metal oxide film composed mainly of a Hf-Zr mixture and O is used, for example, at least any one of impurity elements selected from Si, N, C, and F having a crystal nucleus of orthorhombic crystals may be added to the metal oxide film, which has not yet been heated with microwaves, by ion implantation or the like.

What is claimed is:

1. A method of manufacturing a semiconductor device including a field effect transistor and a capacitor, comprising:
    forming the field effect transistor on a semiconductor substrate, the field effect transistor having a gate insulating film made of silicon oxide film;
    after the forming of the field effect transistor, depositing an interlayer insulating film on the semiconductor substrate; and
    after the depositing of the interlayer insulating film, forming the capacitor on the interlayer insulating film by:
    (a) depositing a first conductor film over the interlayer insulating film;
    (b) after the (a), depositing, over the first conductor film, a metal oxide film having oxygen and hafnium as a main component;
    (c) after the (b), depositing a second conductor film over the metal oxide film;
    (d) after the (c), subjecting the metal oxide film to microwave heat treatment; and
    (e) after the (d), patterning the first conductor film, the metal oxide film and the second conductor film,
    wherein the second conductor film is deposited by RF sputtering, and
    wherein the field effect transistor and the capacitor configure a ferroelectric memory cell.

2. The method of manufacturing a semiconductor device according to claim 1,
    wherein the second conductor film in the step (c) has TiN as a main component.

3. The method of manufacturing a semiconductor device according to claim 1,
    wherein at least any one of elements Si, N, C and F is added to the metal oxide film.

4. The method of manufacturing a semiconductor device according to claim 1,
    wherein the frequency of the microwaves in the step (d) is from 1 GHz to 10 GHz.

5. The method of manufacturing a semiconductor device according to claim 1,
    wherein the metal oxide film is deposited at a temperature of less than 400° C.

* * * * *